(12) United States Patent
Jiang et al.

(10) Patent No.: US 10,771,196 B2
(45) Date of Patent: Sep. 8, 2020

(54) TECHNIQUES FOR SIGNALING COMPRESSED HARQ OR RETRANSMISSION INFORMATION BETWEEN A BASE STATION AND A USER EQUIPMENT

(71) Applicant: QUALCOMM Incorporated, San Diego, CA (US)

(72) Inventors: Jing Jiang, San Diego, CA (US); Seyedkianoush Hosseini, San Diego, CA (US); Jing Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 15/922,063

(22) Filed: Mar. 15, 2018

(65) Prior Publication Data

US 2018/0270023 A1    Sep. 20, 2018

Related U.S. Application Data

(60) Provisional application No. 62/473,789, filed on Mar. 20, 2017.

(51) Int. Cl.
*G08C 25/02* (2006.01)
*H04L 1/18* (2006.01)
(Continued)

(52) U.S. Cl.
CPC ...... *H04L 1/1819* (2013.01); *H03M 13/6306* (2013.01); *H04L 1/0068* (2013.01);
(Continued)

(58) Field of Classification Search
CPC ... H04L 1/1819; H04L 1/0068; H04L 1/0073; H04L 1/1614; H03M 13/6306; H03M 13/13; H03M 13/19
See application file for complete search history.

(56) References Cited

U.S. PATENT DOCUMENTS 8,749,408 B1    6/2014 Li
8,795,565 B2    8/2014 Wei et al.
(Continued)

FOREIGN PATENT DOCUMENTS

EP           1745580 A1    1/2007
WO   WO-2005107127 A1    11/2005

OTHER PUBLICATIONS

International Search Report and Written Opinion—PCT/US2018/022886—ISA/EPO—dated Jun. 28, 2018.

*Primary Examiner* — Samir W Rizk
(74) *Attorney, Agent, or Firm* — Holland & Hart LLP/Qualcomm

(57) ABSTRACT

Techniques are described for wireless communication. One method includes receiving, at a user equipment (UE), a transport block (TB) that includes a plurality of code block groups (CBGs); determining CBG failure information identifying a set of one or more CBGs in the TB that failed to decode at the UE; determining a compressed representation of the CBG failure information; and transmitting, in response to receiving the TB, hybrid automatic repeat request (HARQ) information including the compressed representation of the CBG failure information. The compressed representation of the CBG failure information includes fewer bits of information than the CBG failure information.

25 Claims, 27 Drawing Sheets

(51) Int. Cl.
  *H04L 1/00*    (2006.01)
  *H04L 1/16*    (2006.01)
  *H03M 13/00*   (2006.01)
  *H03M 13/13*   (2006.01)
  *H04L 1/12*    (2006.01)
  *H03M 13/19*   (2006.01)

(52) U.S. Cl.
  CPC .......... *H04L 1/0073* (2013.01); *H04L 1/1614* (2013.01); *H03M 13/13* (2013.01); *H03M 13/19* (2013.01); *H04L 2001/125* (2013.01)

(56) References Cited

U.S. PATENT DOCUMENTS

| | | |
|---|---|---|
| 9,419,778 B2 | 8/2016 | Papasakellariou et al. |
| 2001/0056560 A1* | 12/2001 | Khan .................... H04L 1/1628 714/746 |
| 2005/0251721 A1* | 11/2005 | Ramesh ................ H04L 1/0068 714/748 |
| 2007/0254715 A1 | 11/2007 | Li et al. |
| 2014/0040214 A1 | 2/2014 | Ma et al. |
| 2015/0271816 A1* | 9/2015 | Akkarakaran .... H04W 72/0446 370/336 |
| 2016/0128090 A1 | 5/2016 | Azarian et al. |
| 2016/0233999 A1* | 8/2016 | Chendamarai Kannan .................. H04L 5/0055 |
| 2017/0026297 A1 | 1/2017 | Sun et al. |
| 2017/0207895 A1 | 7/2017 | Yang et al. |
| 2019/0207734 A1* | 7/2019 | Yang ....................... H04L 5/001 |

* cited by examiner

TECHNIQUES FOR SIGNALING COMPRESSED HARQ OR RETRANSMISSION INFORMATION BETWEEN A BASE STATION AND A USER EQUIPMENT

CROSS REFERENCES

The present Application for Patent claims priority to U.S. Provisional Patent Application No. 62/473,789 by Jiang, et al., entitled "Techniques For Signaling Compressed HARQ or Retransmission Information Between a Base Station and a User Equipment," filed Mar. 20, 2017, assigned to the assignee hereof.

BACKGROUND

Field of the Disclosure

The present disclosure, for example, relates to wireless communication systems, and more particularly to techniques for signaling compressed hybrid automatic repeat request (HARQ) or retransmission information between a base station and a user equipment (UE).

Description of Related Art

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

A wireless multiple-access communication system may include a number of base stations, each simultaneously supporting communication for multiple communication devices, otherwise known as UEs. In a Long-Term Evolution (LTE) or LTE-Advanced (LTE-A) network, a set of one or more base stations may define an eNodeB (eNB). In a next generation, new radio (NR), millimeter wave (mmW), or 5 G network, a base station may take the form of a smart radio head (or radio head (RH)) or access node controller (ANC), with a set of smart radio heads in communication with an ANC defining a gNodeB (gNB). A base of clai may communicate with a set of UEs on downlink channels (e.g., for transmissions from a base station to a UE) and uplink channels (e.g., for transmissions from a UE to a base station).

In some communication systems, a base station may transmit longer transmissions to some UEs and shorter transmissions to other UEs, and may puncture the resources allocated to a longer transmission to provide resources for a shorter transmission. The puncturing may cause a UE's attempt to decode portions of the longer transmission to fail. The decoding failures may cause the UE to non-acknowledge (NACK) the receipt of portions of the longer transmission, and may cause the base station to retransmit the portions. In some cases, the base station may provide an indication of the punctured resources to the UE, to assist the UE in decoding other portions of the longer transmission. The signaling related to indicating the punctured resources, indicating the decoding failures, and indicating the portions of the longer transmission that will be transmitted consumes resources.

SUMMARY

Techniques are described for signaling compressed HARQ or retransmission information between a base station and a UE. For example, a UE may receive (e.g., from a base station) a transport block (TB) that includes a plurality of code block groups (CBGs); determine CBG failure information identifying a set of one or more CBGs in the TB that failed to decode at the UE; determine a compressed representation of the CBG failure information; and transmit HARQ information including the compressed representation of the CBG failure information (e.g., to the base station) in response to receiving the TB. The compressed representation of the CBG failure information may include fewer bits of information than the CBG failure information. A base station that receives the HARQ information may determine, based at least in part on the compressed representation of the CBG failure information and a known puncturing of at least one CBG of the TB, a set of one or more CBGs in the TB to retransmit to the UE. In some cases, the base station may determine a compressed indication of the set of one or more CBGs to retransmit to the UE, and may transmit the compressed indication of the CBG retransmission information to the UE in response to receiving the HARQ information from the UE. The UE may determine, based at least in part on the compressed indication of the CBG retransmission information and the set of one or more CBGs in the TB that failed to decode at the UE, the set of one or more CBGs that is to be retransmitted to the UE.

In one example, a method for wireless communication is described. The method may include receiving, at a UE, a TB that includes a plurality of CBGs; determining CBG failure information identifying a set of one or more CBGs in the TB that failed to decode at the UE; determining a compressed representation of the CBG failure information; and transmitting, in response to receiving the TB, HARQ information including the compressed representation of the CBG failure information. The compressed representation of the CBG failure information including fewer bits of information than the CBG failure information.

In one example, an apparatus for wireless communication is described. The apparatus may include means for receiving, at a UE, a TB that includes a plurality of CBGs; means for determining CBG failure information identifying a set of one or more CBGs in the TB that failed to decode at the UE; means for determining a compressed representation of the CBG failure information; and means for transmitting, in response to receiving the TB, HARQ information including the compressed representation of the CBG failure information. The compressed representation of the CBG failure information may include fewer bits of information than the CBG failure information.

In one example, another apparatus for wireless communication is described. The apparatus may include a processor, memory in electronic communication with the processor, and instructions stored in the memory. The instructions may be executable by the processor to receive, at a UE, a TB that includes a plurality of CBGs; determine CBG failure information identifying a set of one or more CBGs in the TB that failed to decode at the UE; determine a compressed representation of the CBG failure information; and transmit, in response to receiving the TB, HARQ information including the compressed representation of the CBG failure information. The compressed representation of the CBG failure information may include fewer bits of information than the CBG failure information.

In one example, a non-transitory computer-readable medium storing computer-executable code for wireless communication is described. The code may be executable by a processor to receive, at a UE, a TB that includes a plurality of CBGs; determine CBG failure information identifying a set of one or more CBGs in the TB that failed to decode at the UE; determine a compressed representation of the CBG failure information; and transmit, in response to receiving the TB, HARQ information including the compressed representation of the CBG failure information. The compressed representation of the CBG failure information including fewer bits of information than the CBG failure information.

Some examples of the method, apparatus, and non-transitory computer-readable medium described above may further include processes, features, means, or instructions for receiving an indication of punctured resources in the TB, and the compressed representation of the CBG failure information may be determined based at least in part on the indication of the punctured resources.

In some examples of the method, apparatus, and non-transitory computer-readable medium described above, determining the compressed representation of the CBG failure information based at least in part on the indication of the punctured resources may include determining a difference between the set of one or more CBGs that failed to decode at the UE and a second set of one or more CBGs that include the punctured resources.

Some examples of the method, apparatus, and non-transitory computer-readable medium described above may further include processes, features, means, or instructions for identifying the difference between the set of one or more CBGs that failed to decode at the UE and the second set of one or more CBGs that include the punctured resources based at least in part on an equation m log_2 N, in which m is a number of CBGs in the difference, and N is a total number of CBGs in the TB.

Some examples of the method, apparatus, and non-transitory computer-readable medium described above may further include processes, features, means, or instructions for identifying the difference between the set of one or more CBGs that failed to decode at the UE and the second set of one or more CBGs that include the punctured resources based at least in part on a starting location and length of at least a first difference between the set of one or more CBGs that failed to decode at the UE and the second set of one or more CBGs that include the punctured resources.

In some examples of the method, apparatus, and non-transitory computer-readable medium described above, determining the compressed representation of the CBG failure information may include encoding the CBG failure information based at least in part on an encoding scheme known to a device that receives the HARQ information including the compressed representation of the CBG failure information, and transmitting the HARQ information including the compressed representation of the CBG failure information may include transmitting at least a portion of the encoded CBG failure information. In some examples, the encoding scheme may be based at least in part on a syndrome matrix, a linear block channel code, a Hamming code, a polar code, or a combination thereof. In some examples, the encoding may be performed based at least in part on a non-receipt, at the UE, of an indication of punctured resources in the TB.

Some examples of the method, apparatus, and non-transitory computer-readable medium described above may further include processes, features, means, or instructions for determining redundancy information for the encoded CBG failure information, and transmitting the HARQ information including the compressed representation of the CBG failure information may include transmitting at least the portion of the encoded CBG failure information with at least a portion of the redundancy information.

In some examples of the method, apparatus, and non-transitory computer-readable medium described above, the TB may be part of an eMBB transmission to the UE, and at least one resource of the eMBB transmission may be punctured by an URLLC associated with a second UE.

In one example, another method for wireless communication is described. The method may include transmitting, to a UE, a TB that includes a plurality of CBGs; receiving from the UE, in response to transmitting the TB, HARQ information including a compressed representation of CBG failure information; and determining, based at least in part on the compressed representation of the CBG failure information and a known puncturing of at least one CBG of the TB, a set of one or more CBGs in the TB to retransmit to the UE. The compressed representation of the CBG failure information may identify a set of one or more CBGs in the TB that failed to decode at the UE.

In one example, another apparatus for wireless communication is described. The apparatus may include means for transmitting, to a UE, a TB that includes a plurality of CBGs; means for receiving from the UE, in response to transmitting the TB, HARQ information including a compressed representation of CBG failure information; and means for determining, based at least in part on the compressed representation of the CBG failure information and a known puncturing of at least one CBG of the TB, a set of one or more CBGs in the TB to retransmit to the UE. The compressed representation of the CBG failure information may identify a set of one or more CBGs in the TB that failed to decode at the UE.

In one example, another apparatus for wireless communication is described. The apparatus may include a processor, memory in electronic communication with the processor, and instructions stored in the memory. The instructions may be executable by the processor to transmit, to a UE, a TB that includes a plurality of CBGs; receive from the UE, in response to transmitting the TB, HARQ information including a compressed representation of CBG failure information; and determine, based at least in part on the compressed representation of the CBG failure information and a known puncturing of at least one CBG of the TB, a set of one or more CBGs in the TB to retransmit to the UE. The compressed representation of the CBG failure information may identify a set of one or more CBGs in the TB that failed to decode at the UE.

In one example, another non-transitory computer-readable medium storing computer-executable code for wireless communication is described. The code may be executable by a processor to transmit, to a UE, a TB that includes a plurality of CBGs; receive from the UE, in response to transmitting the TB, HARQ information including a compressed representation of CBG failure information; and determine, based at least in part on the compressed representation of the CBG failure information and a known puncturing of at least one CBG of the TB, a set of one or more CBGs in the TB to retransmit to the UE. The compressed representation of the CBG failure information may identify a set of one or more CBGs in the TB that failed to decode at the UE.

Some examples of the method, apparatus, and non-transitory computer-readable medium described above may further include processes, features, means, or instructions for transmitting, to the UE, an indication of punctured resources in the TB, and the compressed representation of the CBG failure information may be based at least in part on the indication of the punctured resources.

In some examples of the method, apparatus, and non-transitory computer-readable medium described above, the compressed representation of the CBG failure information may include an indication of a difference between the set of one or more CBGs that failed to decode at the UE and a second set of one or more CBGs that include the punctured resources.

In some examples of the method, apparatus, and non-transitory computer-readable medium described above, determining the set of one or more CBGs to retransmit to the UE may include combining the second set of one or more CBGs that include the punctured resources with a third set of one or more CBGs identified by the difference between the set of one or more CBGs that failed to decode at the UE and the second set of one or more CBGs that include the punctured resources.

In some examples of the method, apparatus, and non-transitory computer-readable medium described above, the difference between the set of one or more CBGs that failed to decode at the UE and the second set of one or more CBGs that include the punctured resources may be based at least in part on an equation $m \log\_2 N$, in which m is a number of CBGs in the difference, and N is a total number of CBGs in the TB.

In some examples of the method, apparatus, and non-transitory computer-readable medium described above, the indication of the difference between the set of one or more CBGs that failed to decode at the UE and the second set of one or more CBGs that include the punctured resources may be based at least in part on a starting location and length of at least a first difference between the set of one or more CBGs that failed to decode at the UE and the second set of one or more CBGs that include the punctured resources.

Some examples of the method, apparatus, and non-transitory computer-readable medium described above may further include processes, features, means, or instructions for identifying an encoding scheme known by the UE, and the compressed representation of the CBG failure information may include the CBG failure information encoded based at least in part on the encoding scheme.

In some examples of the method, apparatus, and non-transitory computer-readable medium described above, determining the set of one or more CBGs to retransmit to the UE may include decoding the encoded CBG failure information based at least in part on the encoding scheme. In some examples, the encoding scheme may be based at least in part on a syndrome matrix, a linear block channel code, a Hamming code, a polar code, or a combination thereof. In some examples, the encoded CBG failure information may be received with redundancy information for the encoded CBG failure information, with the redundancy information being based at least in part on the encoding scheme.

In some examples of the method, apparatus, and non-transitory computer-readable medium described above, the TB may be part of an eMBB transmission to the UE, and at least one resource of the eMBB transmission may be punctured by an URLLC associated with a second UE.

In one example, another method for wireless communication is described. The method may include transmitting, to a UE, a TB that includes a plurality of CBGs; receiving from the UE, in response to transmitting the TB, HARQ information including a representation of CBG failure information identifying a first set of one or more CBGs in the TB that failed to decode at the UE; determining, based at least in part on the representation of the CBG failure information, CBG retransmission information identifying a set of one or more CBGs in the TB to retransmit to the UE; determining a compressed indication of the set of one or more CBGs to retransmit to the UE; and transmitting to the UE, in response to receiving the HARQ information, the compressed indication of the CBG retransmission information. The compressed indication may include fewer bits of information than the CBG retransmission information.

In one example, another apparatus for wireless communication is described. The apparatus may include means for transmitting, to a UE, a TB that includes a plurality of CBGs; means for receiving from the UE, in response to transmitting the TB, HARQ information including a representation of CBG failure information identifying a first set of one or more CBGs in the TB that failed to decode at the UE; means for determining, based at least in part on the representation of the CBG failure information, CBG retransmission information identifying a set of one or more CBGs in the TB to retransmit to the UE; means for determining a compressed indication of the set of one or more CBGs to retransmit to the UE; and means for transmitting to the UE, in response to receiving the HARQ information, the compressed indication of the CBG retransmission information. The compressed indication may include fewer bits of information than the CBG retransmission information.

In one example, another apparatus for wireless communication is described. The apparatus may include a processor, memory in electronic communication with the processor, and instructions stored in the memory. The instructions may be executable by the processor to transmit, to a UE, a TB that includes a plurality of CBGs; receive from the UE, in response to transmitting the TB, HARQ information including a representation of CBG failure information identifying a first set of one or more CBGs in the TB that failed to decode at the UE; determine, based at least in part on the representation of the CBG failure information, CBG retransmission information identifying a set of one or more CBGs in the TB to retransmit to the UE; determine a compressed indication of the set of one or more CBGs to retransmit to the UE; and transmit to the UE, in response to receiving the HARQ information, the compressed indication of the CBG retransmission information. The compressed indication may include fewer bits of information than the CBG retransmission information.

In one example, another non-transitory computer-readable medium storing computer-executable code for wireless communication is described. The code may be executable by a processor to: transmit, to a UE, a TB that includes a plurality of CBGs; receive from the UE, in response to transmitting the TB, HARQ information including a representation of CBG failure information identifying a first set of one or more CBGs in the TB that failed to decode at the UE; determine, based at least in part on the representation of the CBG failure information, CBG retransmission information identifying a set of one or more CBGs in the TB to retransmit to the UE; determine a compressed indication of the set of one or more CBGs to retransmit to the UE; and transmit to the UE, in response to receiving the HARQ information, the compressed indication of the CBG retransmission information. The compressed indication may include fewer bits of information than the CBG retransmission information.

In some examples of the method, apparatus, and non-transitory computer-readable medium described above, determining the compressed indication of the CBG retransmission information may include encoding the CBG retransmission information based at least in part on an encoding scheme known to the UE, and transmitting the compressed indication of the CBG retransmission information may include transmitting at least a portion of the encoded CBG retransmission information. In some examples, the encoding scheme may be based at least in part on a syndrome matrix, a linear block channel code, a Hamming code, a polar code, or a combination thereof.

Some examples of the method, apparatus, and non-transitory computer-readable medium described above may further include processes, features, means, or instructions for determining redundancy information for the encoded CBG retransmission information, and transmitting the compressed indication of the CBG retransmission information may include transmitting at least the portion of the encoded CBG retransmission information with at least a portion of the redundancy information.

In some examples of the method, apparatus, and non-transitory computer-readable medium described above, the HARQ information including the representation of the CBG failure information may be received in uplink control information (UCI).

In some examples of the method, apparatus, and non-transitory computer-readable medium described above, the compressed indication of the CBG retransmission information may be transmitted in downlink control information (DCI) transmitted with the set of one or more CBGs to retransmit to the UE.

In some examples of the method, apparatus, and non-transitory computer-readable medium described above, determining the compressed indication of the CBG retransmission information may include scrambling, based at least in part on the CBG retransmission information, a cyclic redundancy check (CRC) of downlink control information (DCI) transmitted to the UE.

In some examples of the method, apparatus, and non-transitory computer-readable medium described above, determining the compressed indication of the CBG retransmission information may include generating a cyclic redundancy check (CRC) for downlink control information (DCI) transmitted to the UE, the CRC generated based at least in part on the DCI and the CBG retransmission information.

In some examples of the method, apparatus, and non-transitory computer-readable medium described above, the TB may be part of an eMBB transmission to the UE, and at least one resource of the eMBB transmission may be punctured by an URLLC associated with a second UE.

In some examples of the method, apparatus, and non-transitory computer-readable medium described above, the representation of the CBG failure information may include the CBG failure information or a compressed representation of the CBG failure information.

In one example, another method for wireless communication is described. The method may include receiving, at a UE, a TB that includes a plurality of CBGs; transmitting, in response to receiving the TB, HARQ information including a representation of CBG failure information identifying a first set of one or more CBGs in the TB that failed to decode at the UE; receiving, at the UE, a compressed indication of CBG retransmission information; and determining, based at least in part on the compressed indication of the CBG retransmission information and the first set of one or more CBGs in the TB that failed to decode at the UE, a second set of one or more CBGs that is to be retransmitted to the UE.

In one example, another apparatus for wireless communication is described. The apparatus may include means for receiving, at a UE, a TB that includes a plurality of CBGs; means for transmitting, in response to receiving the TB, HARQ information including a representation of CBG failure information identifying a first set of one or more CBGs in the TB that failed to decode at the UE; means for receiving, at the UE, a compressed indication of CBG retransmission information; and means for determining, based at least in part on the compressed indication of the CBG retransmission information and the first set of one or more CBGs in the TB that failed to decode at the UE, a second set of one or more CBGs that is to be retransmitted to the UE.

In one example, another apparatus for wireless communication is described. The apparatus may include a processor, memory in electronic communication with the processor, and instructions stored in the memory. The instructions may be executable by the processor to receive, at a UE, a TB that includes a plurality of CBGs; transmit, in response to receiving the TB, HARQ information including a representation of CBG failure information identifying a first set of one or more CBGs in the TB that failed to decode at the UE; receive, at the UE, a compressed indication of CBG retransmission information; and determine, based at least in part on the compressed indication of the CBG retransmission information and the first set of one or more CBGs in the TB that failed to decode at the UE, a second set of one or more CBGs that is to be retransmitted to the UE.

In one example, another non-transitory computer-readable medium storing computer-executable code for wireless communication is described. The code may be executable by a processor to: receive, at a UE, a TB that includes a plurality of CBGs; transmit, in response to receiving the TB, HARQ information including a representation of CBG failure information identifying a first set of one or more CBGs in the TB that failed to decode at the UE; receive, at the UE, a compressed indication of CBG retransmission information; and determine, based at least in part on the compressed indication of the CBG retransmission information and the first set of one or more CBGs in the TB that failed to decode at the UE, a second set of one or more CBGs that is to be retransmitted to the UE.

Some examples of the method, apparatus, and non-transitory computer-readable medium described above may further include processes, features, means, or instructions for comparing the second set of one or more CBGs to be retransmitted to the UE to the first set of one or more CBGs in the TB; identifying at least one CBG in the first set that is in the second set; and decoding the identified at least one CBG.

Some examples of the method, apparatus, and non-transitory computer-readable medium described above may further include processes, features, means, or instructions for comparing the second set of one or more CBGs to be retransmitted to the UE to the first set of one or more CBGs in the TB; identifying at least one CBG in the first set that is not in the second set; and transmitting a retransmission request for the identified at least one CBG.

Some examples of the method, apparatus, and non-transitory computer-readable medium described above may further include processes, features, means, or instructions for identifying an encoding scheme known by a device that transmits the compressed indication of the CBG retransmission information, and the compressed indication of the CBG retransmission information may include the CBG retransmission information encoded based at least in part on the encoding scheme.

In some examples of the method, apparatus, and non-transitory computer-readable medium described above, determining the second set of one or more CBGs that is to be retransmitted to the UE may include decoding the encoded CBG retransmission information based at least in part on the encoding scheme.

In some examples of the method, apparatus, and non-transitory computer-readable medium described above, the encoding scheme may be based at least in part on a syndrome matrix, a linear block channel code, a Hamming code, a polar code, or a combination thereof.

In some examples of the method, apparatus, and non-transitory computer-readable medium described above, the encoded CBG retransmission information may be received with redundancy information for the encoded CBG retransmission information, with the redundancy information being based at least in part on the encoding scheme.

In some examples of the method, apparatus, and non-transitory computer-readable medium described above, the compressed indication of the CBG retransmission information may be received in DCI associated with the second set of one or more CBGs.

In some examples of the method, apparatus, and non-transitory computer-readable medium described above, receiving the compressed indication of the CBG retransmission information may include receiving DCI having a CRC scrambled based at least in part on the CBG retransmission information.

In some examples of the method, apparatus, and non-transitory computer-readable medium described above, receiving the compressed indication of the CBG retransmission information may include receiving DCI having a CRC generated based at least in part on the DCI and the CBG retransmission information.

In some examples of the method, apparatus, and non-transitory computer-readable medium described above, the HARQ information may include the representation of the CBG failure information is transmitted in UCI.

In some examples of the method, apparatus, and non-transitory computer-readable medium described above, the TB may be part of an eMBB transmission to the UE, and at least one resource of the eMBB transmission may be punctured by an URLLC associated with a second UE.

In some examples of the method, apparatus, and non-transitory computer-readable medium described above, the representation of the CBG failure information may include the CBG failure information or a compressed representation of the CBG failure information.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Systems, apparatus, methods, and computer-readable mediums for signaling compressed HARQ or retransmission information between a base station and a UE are described.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various operations may be added, omitted, or combined. Also, features described with respect to some examples may be combined in some other examples.

Figure 1:
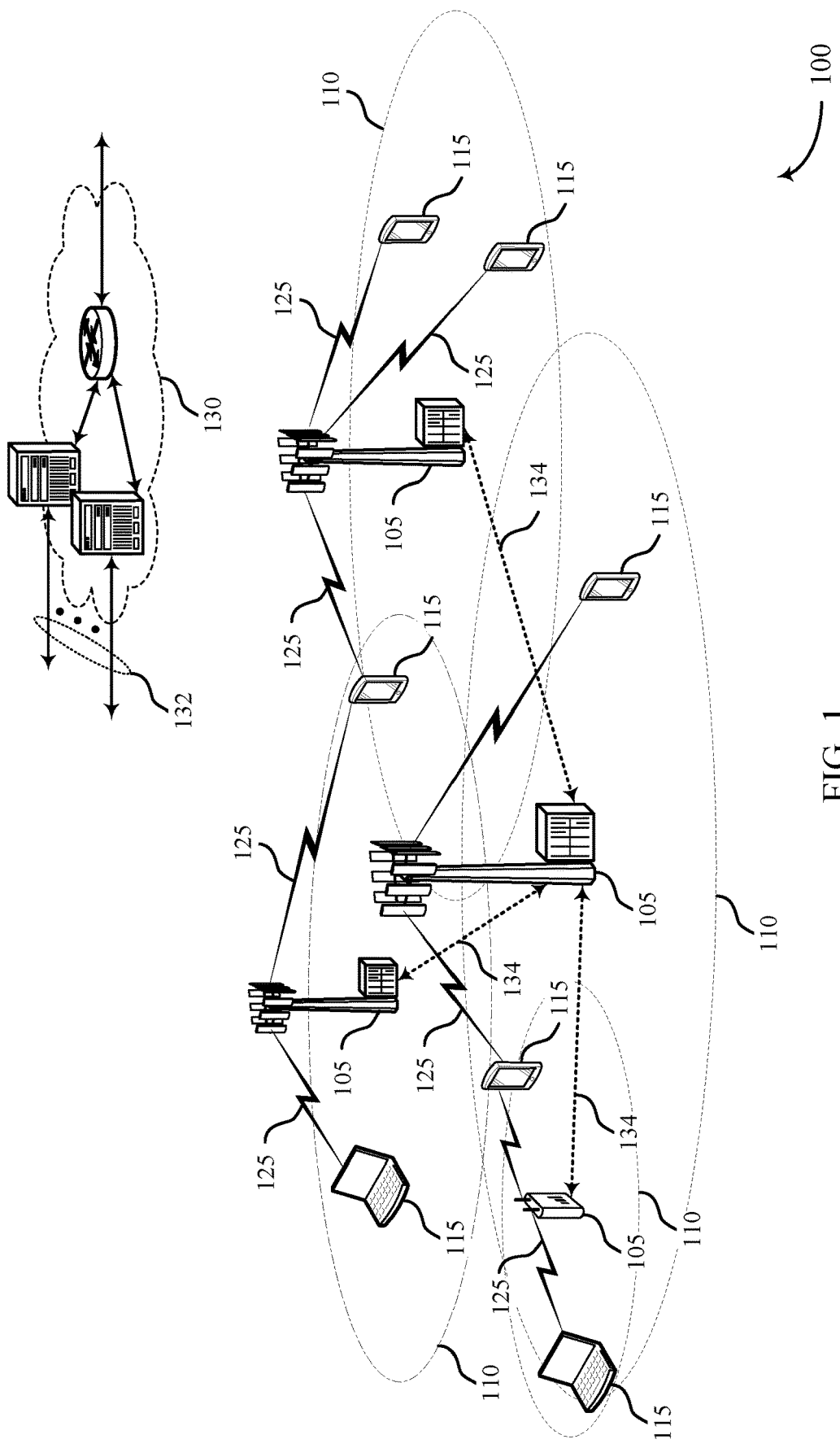
FIG. 1 illustrates an example of a wireless communication system in accordance with various aspects of the present disclosure.

FIG. 1 illustrates an example of a wireless communication system 100 in accordance with various aspects of the present disclosure. The wireless communication system 100 includes base stations 105, UEs 115, and a core network 130. In some examples, the wireless communication system 100 may be a Long Term Evolution (LTE), LTE-Advanced (LTE-A) network, or a New Radio (NR) network. In some cases, wireless communication system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communication system 100 may include uplink (UL) transmissions from a UE 115 to a base station 105, or downlink (DL) transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a TTI of a downlink channel may be distributed between different control regions in a cascaded manner (e.g., between a common control region and one or more UE-specific control regions).

UEs 115 may be dispersed throughout the wireless communication system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the geographic coverage area 110 of a cell. Other UEs 115 in such a group may be outside the geographic coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communication system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) or gNodeBs (gNBs).

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS).

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

At times, a UE 115 may perform an initial access (or initial acquisition) procedure with a base station 105. When performing the initial access procedure, the UE 115 may search for a DRS, synchronization channel, MRS, BTS, or other signal transmitted by the base station 105. The signal may include information usable by the UE 115 to synchronize the UE 115 with the base station 105, so that the UE 115 may communicate with the base station 105. After synchronizing with the base station 105, the UE 115 may initiate a random access procedure with the base station by transmitting a random access preamble to the base station.

Figure 2:
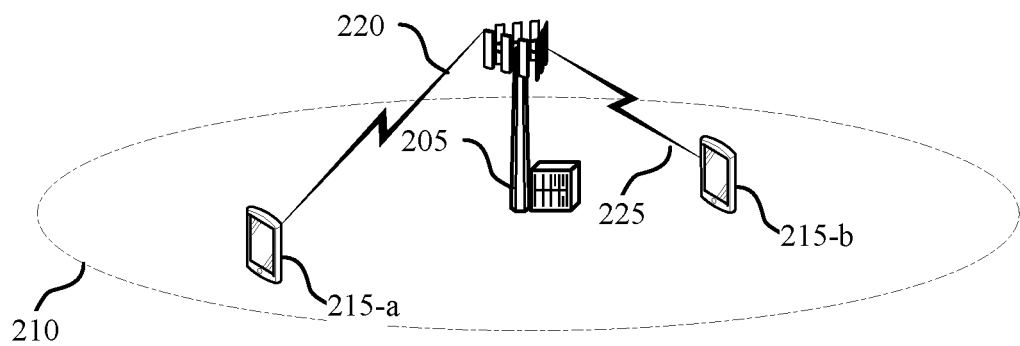
FIG. 2 shows an example of a wireless communication system, in accordance with various aspects of the present disclosure.

FIG. 2 shows an example of a wireless communication system 200, in accordance with various aspects of the present disclosure. The wireless communication system 200 may be an example of aspects of the wireless communication system 100, and may include a base station 205, a first UE 215-a, and a second UE 215-b. The UEs 215 may be within a coverage area 210 of the base station 205. The base station 205 and UEs 215 may be examples of aspects of the base stations and UEs described with reference to FIG. 1.

In some examples, the base station 205 may transmit an eMBB transmission 220 (e.g., a physical downlink shared channel (PDSCH) transmission) to the first UE 215-a (or to a first set of UEs including the first UE 215-a). The eMBB transmission 220 may be scheduled/transmitted on a slot basis.

The base station 205 may also transmit a URLLC transmission 225 to the second UE 215-b (or to a second set of UEs including the second UE 215-b). In some cases, the URLLC transmission 225 may be transmitted in parallel with the eMBB transmission 220. The base station 205 may schedule/transmit the URLLC transmission 225 on a mini-slot basis, and may allocate resources for the URLLC transmission 225 by puncturing resources allocated for the ongoing eMBB transmission. The puncturing may pre-empt one or more portions of the eMBB transmission, and may often make it difficult for the first UE 215-a to decode those portions (e.g., CBGs) of the eMBB transmission 220 containing punctured resources.

Figure 3:
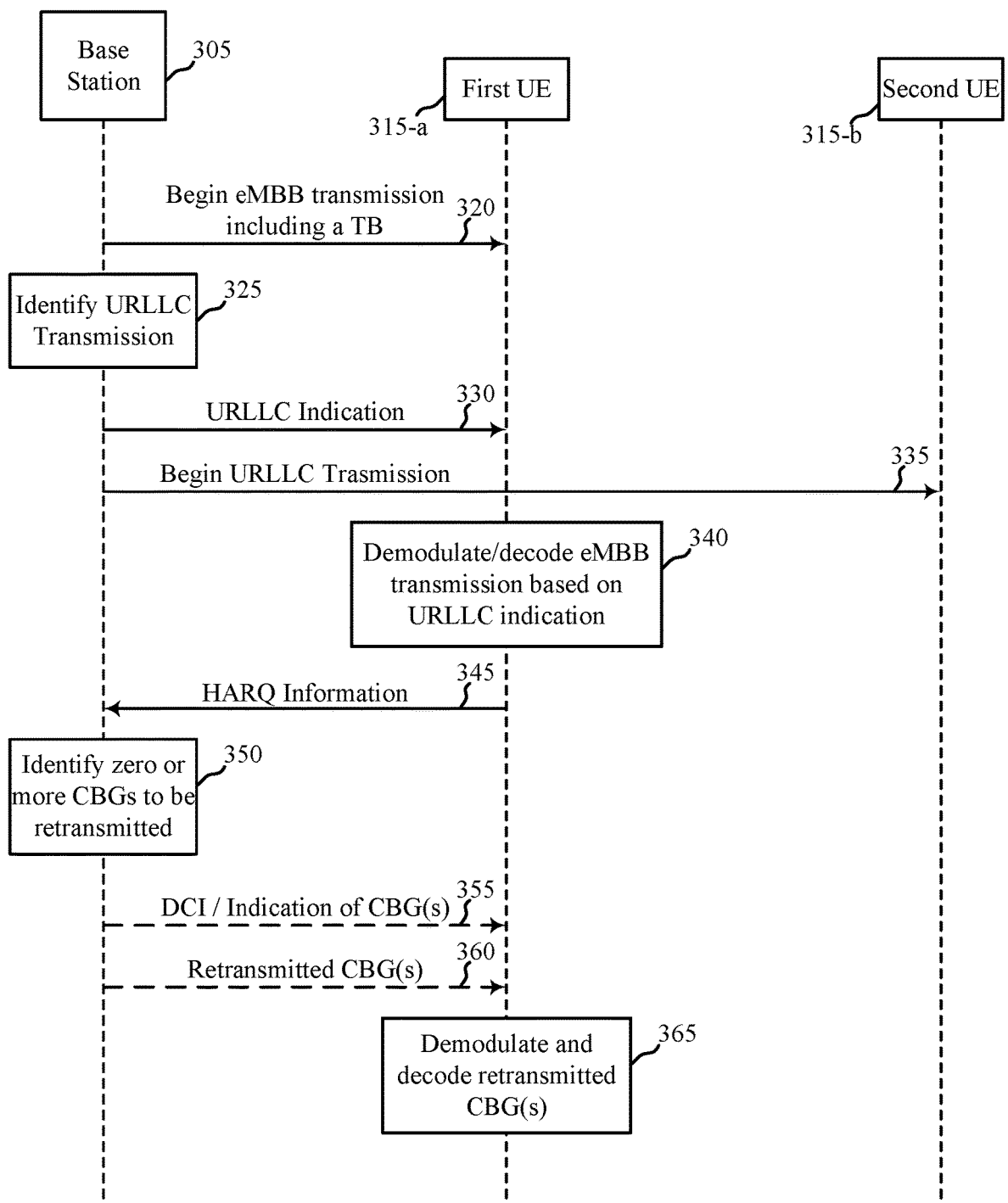
FIG. 3 shows an example message flow between a base station, a first UE, and a second UE, in accordance with various aspects of the present disclosure.

FIG. 3 shows an example message flow 300 between a base station 305, a first UE 315-a, and a second UE 315-b, in accordance with various aspects of the present disclosure. The base station 305, first UE 315-a, and second UE 315-b may be examples of aspects of one or more of the base stations or UEs described with reference to FIGS. 1 and 2.

At 320, the base station 305 may begin an eMBB transmission (e.g., a PDSCH transmission) to the first UE 315-a (or to a first set of UEs including the first UE 315-a). At 325, the base station 305 may identify a URLLC transmission to be made to the second UE 315-b (or to a second set of UEs including the second UE 315-b). The base station 305 may allocate resources for the URLLC transmission by puncturing resources allocated for the ongoing eMBB transmission, and may pre-empt one or more portions of the eMBB transmission.

At 330, the base station 305 may transmit a URLLC indication to the first UE 315-a. The URLLC indication may indicate resources allocated to the eMBB transmission that are punctured by the URLLC transmission.

At 335, the base station 305 may begin the URLCC transmission, and may multiplex transmission of the URLLC transmission to the second UE 315-b, on resources allocated for the URLCC transmission, with continued transmission of the eMBB transmission to the first UE 315-a, on resources allocated for the eMBB transmission. At 340, the first UE 315-a may use the URLLC indication to demodulate and decode the eMBB transmission while the URLCC transmission is being transmitted. In some examples, the first UE 315-a may null LLRs impacted by the resource puncture for the URLCC transmission.

In some cases, the puncture of a code block of the eMBB transmission may cause the first UE to be unable to demodulate and decode the code block. In other cases, the puncture of a code block of the eMBB transmission may not cause the first UE to be unable to demodulate and decode the code block.

At 345, the first UE 315-a may transmit multi-bit HARQ feedback (e.g., a HARQ bitmap) to the base station 305. In some examples, the multi-bit HARQ feedback may include a bit per CBG of a TB of the eMBB transmission. In some examples, a bit of the multi-bit HARQ feedback may be set to 1 to acknowledge (ACK) receipt of a CBG, and to 0 to non-acknowledge (NACK) receipt of a CBG.

At 350, the base station 305 may determine, from the HARQ feedback received at 345, zero or more CBGs of the eMBB transmission that need to be retransmitted to the first UE 315-a.

At 355, the base station 305 may transmit, to the first UE 315-a, DCI including an indication of one or more CBGs (of the eMBB transmission), if any, that will be retransmitted to the first UE 315-a. In some examples, the indication may take the form of a CBG retransmission bitmap. At 360, the base station 305 may retransmit the one or more CBGs of the eMBB transmission to the first UE 315-a.

At 365, the first UE 315-a may demodulate and decode the retransmitted CBGs of the eMBB transmission, if any.

The URLLC indication transmitted at 330, the multi-bit HARQ feedback transmitted at 345, and the indication of one or more CBGs transmitted at 355 may or may not include the same information, but may be highly correlated.

Figure 4:
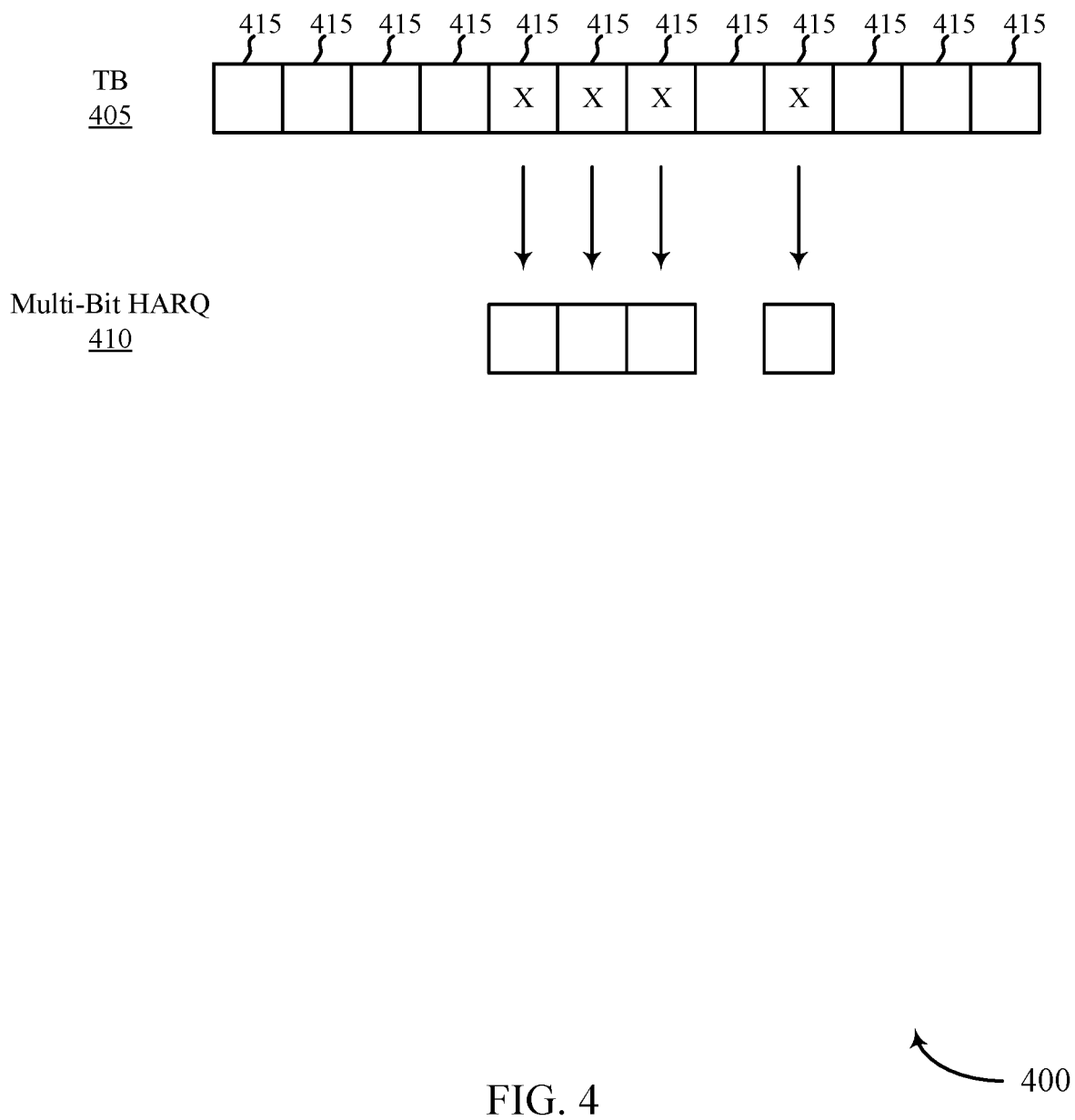
FIG. 4 shows a timeline of transmissions between a base station and a UE, in accordance with various aspects of the present disclosure.

FIG. 4 shows a timeline 400 of transmissions between a base station and a UE, in accordance with various aspects of the present disclosure. The transmissions include a transmission of a TB 405 (e.g., a TB of a PDSCH) from the base station to the UE, and a transmission of multi-bit HARQ feedback 410 from the UE to the base station. In some examples, the transmission of the TB 405 may be an example of transmission of a TB at 320 in FIG. 3, and the transmission of the multi-bit HARQ feedback 410 may be an example of transmission of multi-bit HARQ feedback at 345 in FIG. 3. In some examples, the base station and UE may be examples of aspects of one or more the base stations or UEs described with reference to FIGS. 1-3.

By way of example, the TB 405 is shown to include twelve CBGs 415. However, four of the CBGs 415 are punctured by a URLLC transmission (indicated by "X"s). Assuming that the UE is unable to decode the CBGs 415 in which resources are punctured, the UE may fail to decode the CBGs 415 marked with "X"s and may NACK receipt of these CBGs in multi-bit HARQ feedback 410 transmitted to the base station. For example, the UE may determine CBG failure information for the TB 405 and transmit the multi-bit HARQ feedback: 111100010111, where each 1 indicates an ACK of a corresponding CBG, and each 0 indicates a NACK of a corresponding CBG.

The base station may predict the multi-bit HARQ feedback 410 based on its puncture of resources for the URLLC transmission (e.g., the base station may predict which punctures will cause the UE to not receive a CBG (e.g., based on the locations of the punctures)). When the base station and UE communicate over a channel subject to inter-cell URLLC interference, or random interference, the base station may not be able to predict the multi-bit HARQ feedback 410, or may incorrectly predict the multi-bit HARQ feedback 410. In these latter examples, the base station may have CBG decode pass/fail prediction information y, with y being based on the base station's known puncturing of resources, and the likely effect that the puncturing will have on the UE's ability to decode one or more CBGs in which the punctured resources are located. The UE may have actual CBG decode pass/fail information x, with x=y⊕e and y=x⊕e, where e represents additional CBG decode failures due to UE decoding failures or neighbor cell bursty interference not experienced by the base station, and ⊕ denotes an exclusive-OR operation. When the UE transmits the CBG decode pass/fail information x to the base station, as multi-bit HARQ feedback, the base station may receive the multi-bit HARQ feedback as z, where z=x⊕n and n represents errors in z (e.g., flipped bits) as a result of channel noise.

Figure 5:
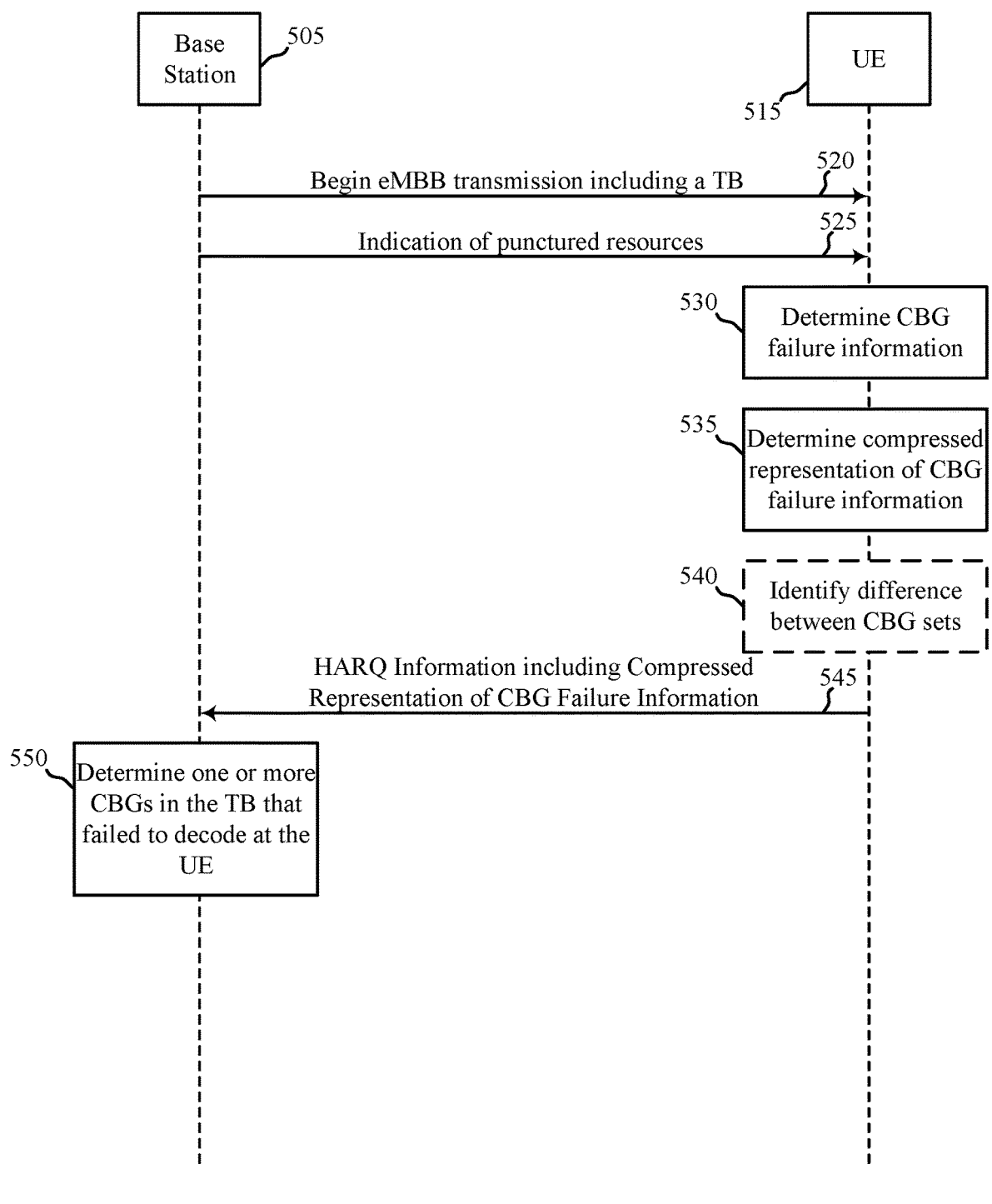
FIG. 5 shows an example message flow between a base station and a UE, in accordance with various aspects of the present disclosure.
Figure 6:
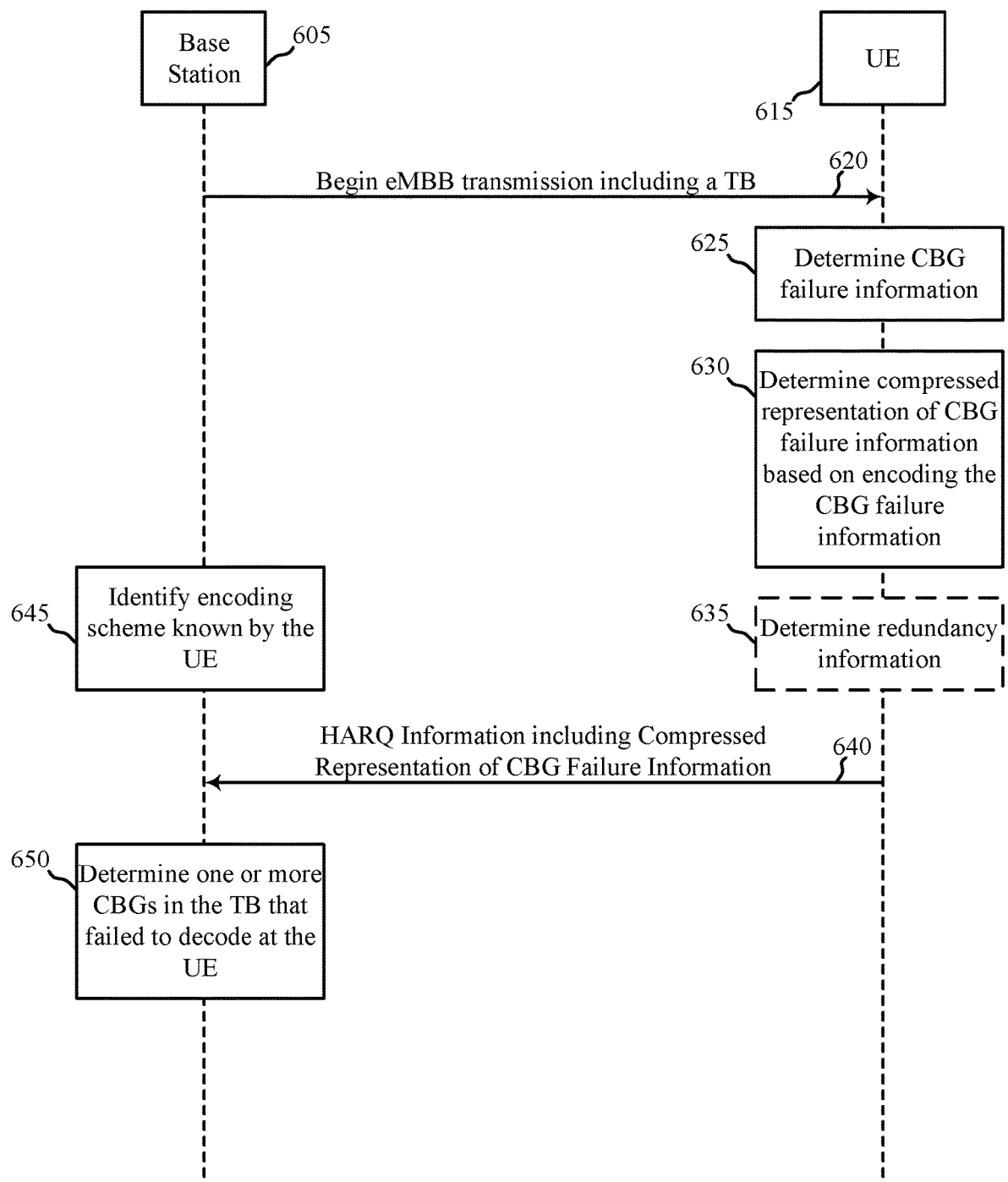
FIG. 6 shows an example message flow between a base station and a UE, in accordance with various aspects of the present disclosure.
Figure 7:
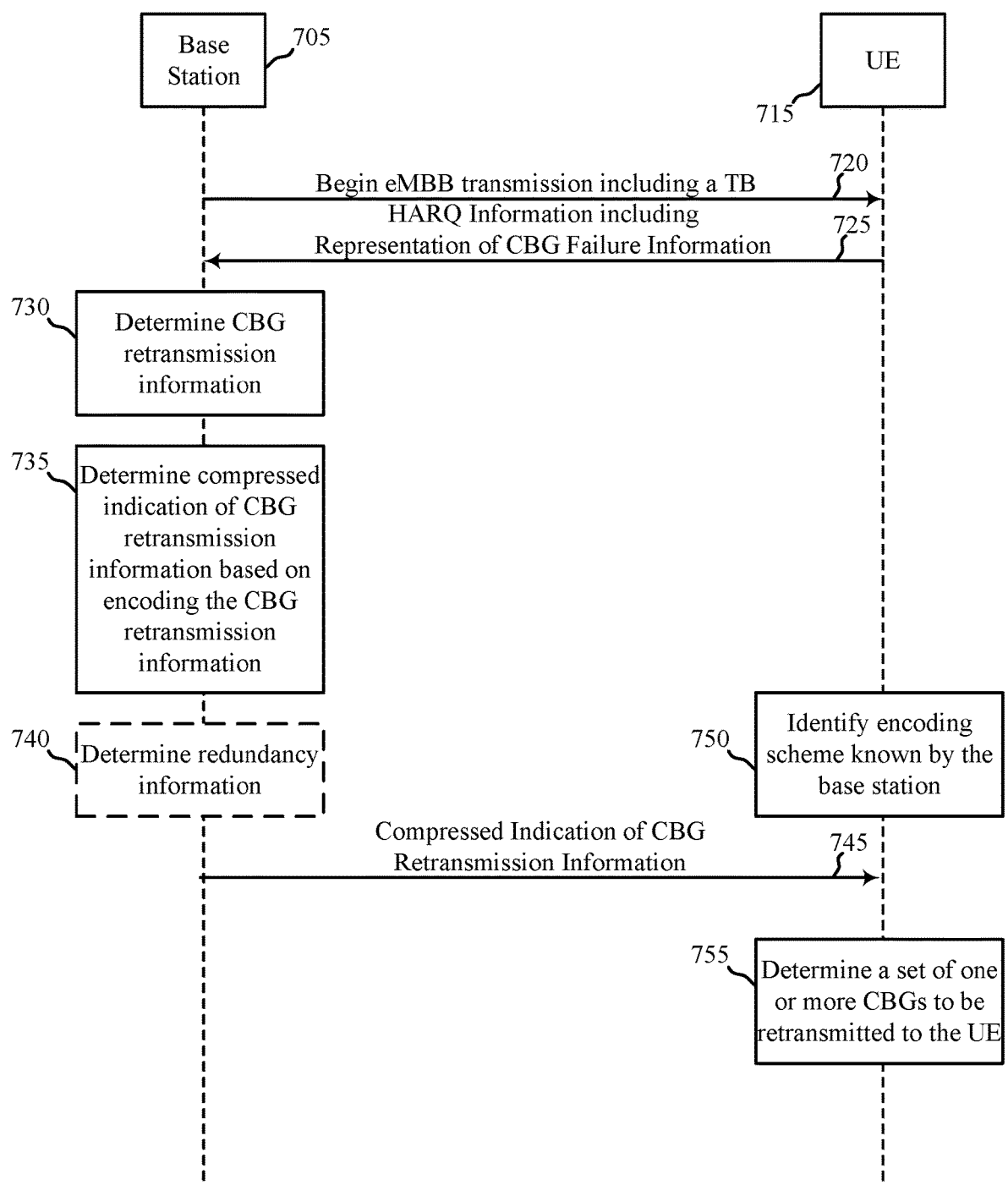
FIG. 7 shows an example message flow between a base station and a UE, in accordance with various aspects of the present disclosure.

Signaling x, y, and z back and forth between a base station and UE can be highly redundant. However, assuming that x=y=z may not be robust and may cause significant loss when e or n is not zero (even when e or n is small). FIGS. 5 and 6 illustrate techniques for compressing x to form a compressed representation for over-the-air transmission, and techniques for transmitting x with redundant information so that x may be correctly decoded in the presence of interference. FIG. 7 illustrates techniques for compressing an indication of CBGs to be retransmitted to a UE, and for transmitting the indication of retransmitted CBGs with redundant information so that the indication of CBGs may be correctly decoded in the presence of interference.

FIG. 5 shows an example message flow 500 between a base station 505 and a UE 515, in accordance with various aspects of the present disclosure. The base station 505 and UE 515 may be examples of aspects of one or more of the base stations or UEs described with reference to FIGS. 1-3.

At 520, the base station 505 may begin an eMBB transmission (e.g., a PDSCH transmission) to the UE 515 (or to a first set of UEs including the UE 515). The eMBB transmission may include a number of TBs, with at least some TBs including a plurality of CBGs. Subsequently, the base station 505 may identify a URLLC transmission to be made to another UE (or to another set of UEs). The base station 505 may allocate resources for the URLLC transmission by puncturing resources allocated for the ongoing eMBB transmission, and may pre-empt one or more portions of the eMBB transmission.

At 525, the base station 505 may transmit a URLLC indication to the UE 515. The URLLC indication may indicate resources allocated to the eMBB transmission that are punctured by the URLLC transmission (e.g., resources in one or more TBs, or resources in one or more CBGs of one or more TBs, that are punctured by the URLLC transmission).

At 530, the UE 515 may determine CBG failure information identifying a set of one or more CBGs (in a TB) that failed to decode at the UE 515 (e.g., the UE 515 may determine CBG decode pass/fail information, or x). At 535, the UE 515 may determine a compressed representation of the CBG failure information. In some examples, the CBG failure information may be as described in FIG. 4, in which a bitmap, list, or other representation of failed CBGs is determined for the TB. The compressed representation of the CBG failure information may include fewer bits of information than the CBG failure information.

The compressed representation of the CBG failure information may be determined based at least in part on the indication of the punctured resources received at 525. For example, the UE 515 may derive y from the indication of the punctured resources received at 525, and may use the equation y=x⊕e to determine e, with e being the compressed representation of the CBG failure information. In some examples, determining the compressed representation of the CBG failure information based at least in part on the indication of the punctured resources may include determining a difference between the set of one or more CBGs that failed to decode at the UE and a second set of one or more CBGs that include the punctured resources.

At 540, the UE 515 may optionally identify the difference between the set of one or more CBGs that failed to decode at the UE 515 and the second set of one or more CBGs that include the punctured resources based at least in part on an equation m log$_2$ N, in which m is a number of CBGs in the difference, and N is a total number of CBGs in the TB. A single CBG error in e may therefore be represented by log$_2$ N bits, two CBG errors may be represented by 2 log$_2$ N bits, etc. Also or alternatively, the UE 515 may identify the difference between the set of one or more CBGs that failed to decode at the UE 515 and the second set of one or more CBGs that include the punctured resources based at least in part on a starting location and length of at least a first difference between the set of one or more CBGs that failed to decode at the UE and the second set of one or more CBGs that include the punctured resources. For example, assuming bursty interference, the difference between the set of one or more CBGs that failed to decode at the UE 515 and the second set of one or more CBGs that include the punctured resources may be represented as a starting location and burst length of ~2 log$_2$ N bits.

At 545, the UE 515 may transmit HARQ information to the base station 505, in response to receiving the TB. The HARQ information may include the compressed representation of the CBG failure information. Alternatively, when the number of bits needed to represent e exceed the capability of the compression (e.g., when the number of bits needed to represent e exceed a maximum number of bits allocated for indicating the compressed representation of the CBG failure information, the UE 515 may transmit TB-level HARQ information (instead of CBG-level HARQ information).

At 550, the base station 505 may determine, based at least in part on the compressed representation of the CBG failure information and a known puncturing of at least one CBG of the TB, a set of one or more CBGs in the TB to retransmit to the UE 515. The puncturing of the at least one CBG of the TB is known to the base station 505 because the base station 505 is the device that punctures the resources. In some examples, the base station 505 may determine the set of one or more CBGs to retransmit to the UE 515 by combining the second set of one or more CBGs that include the punctured resources (y) with a third set of one or more CBGs (e) identified by the difference between the set of one or more CBGs that failed to decode at the UE (x) and the second set of one or more CBGs that include the punctured resources (y) (e.g., based on the equation x=y⊕e).

FIG. 6 shows an example message flow 600 between a base station 605 and a UE 615, in accordance with various aspects of the present disclosure. The base station and UE 615 may be examples of aspects of one or more of the base stations or UEs described with reference to FIGS. 1-3 and 5.

At 620, the base station 605 may begin an eMBB transmission (e.g., a PDSCH transmission) to the UE 615 (or to a first set of UEs including the UE 615). The eMBB transmission may include a number of TBs, with at least some TBs including a plurality of CBGs. Subsequently, the base station 605 may identify a URLLC transmission to be made to another UE (or to another set of UEs). The base station 605 may allocate resources for the URLLC transmission by puncturing resources allocated for the ongoing eMBB transmission, and may pre-empt one or more portions of the eMBB transmission.

At 625, the UE 615 may determine CBG failure information identifying a set of one or more CBGs (in a TB) that failed to decode at the UE 615 (e.g., the UE 615 may determine CBG decode pass/fail information, or x). At 630, the UE 615 may determine a compressed representation of the CBG failure information. The compressed representation of the CBG failure information may include fewer bits of information than the CBG failure information, and may be determined by encoding the CBG failure information based at least in part on an encoding scheme known to the base station 605. In some examples, the encoding may be performed when the UE 615 does not receive an indication of resources that are punctured in the TB. In some examples, the encoding scheme may be based at least in part on a syndrome matrix, a linear block channel code, a Hamming code, a polar code, or a combination thereof.

In some examples, the compressed representation of the CBG failure information may be a matrix, S, determined by encoding the CBG failure information (x) to syndromes according to the equation:

$$S=Hx=Hy+He$$

where H is a syndrome matrix based on a Hamming code. For example, when the total number of CBGs in a TB is N=15, H may be a Hamming code of (15, 4) that compresses 15 bits of information to 4 bits of information. In other examples, other linear block channel codes may be used to compress the CBG failure information. For example, a polar code may be used to compress the CBG failure information by forming syndromes on the information bits.

At 635, the UE 615 may optionally determine redundancy information for the encoded CBG failure information.

At 640, the UE 615 may transmit HARQ information to the base station 605, in response to receiving the TB. The HARQ information may include the compressed representation of the CBG failure information, including at least a portion of the encoded CBG failure information and/or a portion of the redundancy information.

At 645, the base station 605 may identify the encoding scheme used by the UE 615 at 630. The encoding scheme may be identified by the base station 605 because the encoding scheme is agreed to by the base station 605 and UE 615 in advance, or because the encoding scheme is standardized, or based at least in part on an analysis of the HARQ information (e.g., based at least in part on blind detection of the encoding scheme).

At 650, the base station 605 may determine, based at least in part on the compressed representation of the CBG failure information and a known puncturing of at least one CBG of the TB, a set of one or more CBGs in the TB to retransmit to the UE 615. The puncturing of the at least one CBG of the TB is known to the base station 605 because the base station 605 is the device that punctures the resources.

In some examples, the base station 605 may receive the compressed representation of the CBG failure information as S, and may recover x based on the side information y and the equations:

$$S'=S-Hy=He$$

$$x=y+e$$

In some examples, CBG failure information transmitted by a UE may be corrupted due to channel noise, and may be received by a base station as z, where z=x⊕n. Similarly, the compressed representation of the CBG failure information transmitted by the UE 615 may be corrupted due to channel noise (e.g., one or more information bits may be flipped). In some examples, the transmitted information may be recovered based on the redundancy information determined at 635 (when at least a portion of the redundancy information is transmitted at 640). When at least a portion of the redundancy information is transmitted, z may become z', where z'=p⊕n, and where p represents an encoded x with redundancy information (e.g., with parity bits).

FIG. 7 shows an example message flow 700 between a base station 705 and a UE 715, in accordance with various aspects of the present disclosure. The base station and UE 715 may be examples of aspects of one or more of the base stations or UEs described with reference to FIGS. 1-3, 5, and 6.

At 720, the base station 705 may begin an eMBB transmission (e.g., a PDSCH transmission) to the UE 715 (or to a first set of UEs including the UE 715). The eMBB transmission may include a number of TBs, with at least some TBs including a plurality of CBGs. Subsequently, the base station 705 may identify a URLLC transmission to be made to another UE (or to another set of UEs). The base station 705 may allocate resources for the URLLC transmission by puncturing resources allocated for the ongoing eMBB transmission, and may pre-empt one or more portions of the eMBB transmission.

At 725, the UE 715 may transmit HARQ information to the base station 705, in response to receiving a TB. In some examples, the HARQ information may be received in UCI. The HARQ information may include a representation of CBG failure information identifying a first set of one or more CBGs in the TB that failed to decode at the UE 715. The representation of the CBG failure information may include uncompressed CBG failure information or a compressed representation of the CBG failure information. In the latter case, the compressed representation of the CBG failure information may take one of the forms described with reference to FIG. 5 or 6, and may be processed by the base station 705 as described with reference to FIG. 5 or 6.

At 730, the base station 705 may determine, based at least in part on the representation of the CBG failure information, CBG retransmission information identifying a set of one or more CBGs (in the TB) to retransmit to the UE 715. At 735, the base station 705 may determine a compressed indication of the set of one or more CBGs to retransmit to the UE. The compressed indication may include fewer bits of information than the CBG retransmission information, and may be determined by encoding the CBG retransmission information based at least in part on an encoding scheme known to the UE 715. In some examples, the encoding scheme may be based at least in part on a syndrome matrix, a linear block channel code, a Hamming code, a polar code, or a combination thereof.

In some examples, the base station 705 may receive the representation of the CBG failure information as z, where $z=x \oplus n$. In these examples, the base station 705 may encode the CBG retransmission information in a matrix, S, where:

$$S=Hz=Hx+Hn$$

H may be a syndrome matrix based on a Hamming code. For example, when the total number of CBGs in a TB is N=15, H may be a Hamming code of (15, 4) that compresses 15 bits of information to 4 bits of information. In other examples, other linear block channel codes may be used to compress the CBG retransmission information. For example, a polar code may be used to compress the CBG failure information by forming syndromes on the information bits.

In some examples, the base station 705 may encode the CBG retransmission information by scrambling a CRC of DCI transmitted to the UE 715 based at least in part on the CBG retransmission information.

In some examples, the base station 705 may encode the CBG retransmission information by generating a CRC for DCI transmitted to the UE 715, with the CRC being generated based at least in part on the DCI and the CBG retransmission information.

At 740, the base station 705 may optionally determine redundancy information for the encoded CBG retransmission information.

At 745, the base station 705 may transmit the compressed indication of the CBG retransmission information to the UE 715, in response to receiving the HARQ information at 725. The compressed indication of the CBG retransmission information may include at least a portion of the encoded CBG retransmission information and/or a portion of the redundancy information. In some examples, the compressed indication of the CBG retransmission information may be transmitted in DCI, and the set of one or more CBGs that are to be retransmitted to the UE may be transmitted on the shared channel (e.g., on a PDSCH).

At 750, the UE 715 may identify the encoding scheme used by the base station 705 at 735. The encoding scheme may be identified by the UE 715 because the encoding scheme is agreed to by the base station 705 and UE 715 in advance, or because the encoding scheme is standardized, or based at least in part on an analysis of the compressed indication of the CBG retransmission information (e.g., based at least in part on blind detection of the encoding scheme).

At 755, the UE 715 may determine, based at least in part on the compressed indication of the CBG retransmission information and the first set of one or more CBGs in the TB that failed to decode at the UE, a second set of one or more CBGs that is to be retransmitted to the UE 715. In some examples, determining the second set of one or more CBGs that is to be retransmitted to the UE may include decoding the encoded CBG retransmission information based at least in part on the encoding scheme identified 750.

In some examples, the UE 715 may receive the compressed indication of the CBG retransmission information as S, and may recover z based on the side information x and the equations:

$$S'=S-Hx=Hn$$

$$z=x+n$$

In some examples, CBG retransmission information transmitted by a UE may be corrupted due to channel noise. Similarly, the compressed indication of the CBG retransmission information transmitted by the base station 705 may be corrupted due to channel noise (e.g., one or more information bits may be flipped). In some examples, the transmitted information may be recovered based on the redundancy information determined at 740 (when at least a portion of the redundancy information is transmitted at 745).

In some examples, the UE 715 may compare the second set of one or more CBGs to be retransmitted to the UE to the first set of one or more CBGs that failed to decode at the UE 715. Upon identifying at least one CBG in the first set that is included in the second set, the UE 715 may decode the identified at least one CBG. Upon identifying at least one CBG in the first set that is not included in the second set, the UE 715 may transmit a retransmission request for the identified at least one CBG. In some examples, the UE 715 may compare the second set of one or more CBGs to be retransmitted to the UE to the first set of one or more CBGs that failed to decode at the UE 715 by determining whether the equation S=Hx is true (which would mean n=0). In some examples, the UE 715 may only update log-likelihood ratios (LLRs) when n=0.

Figure 8:
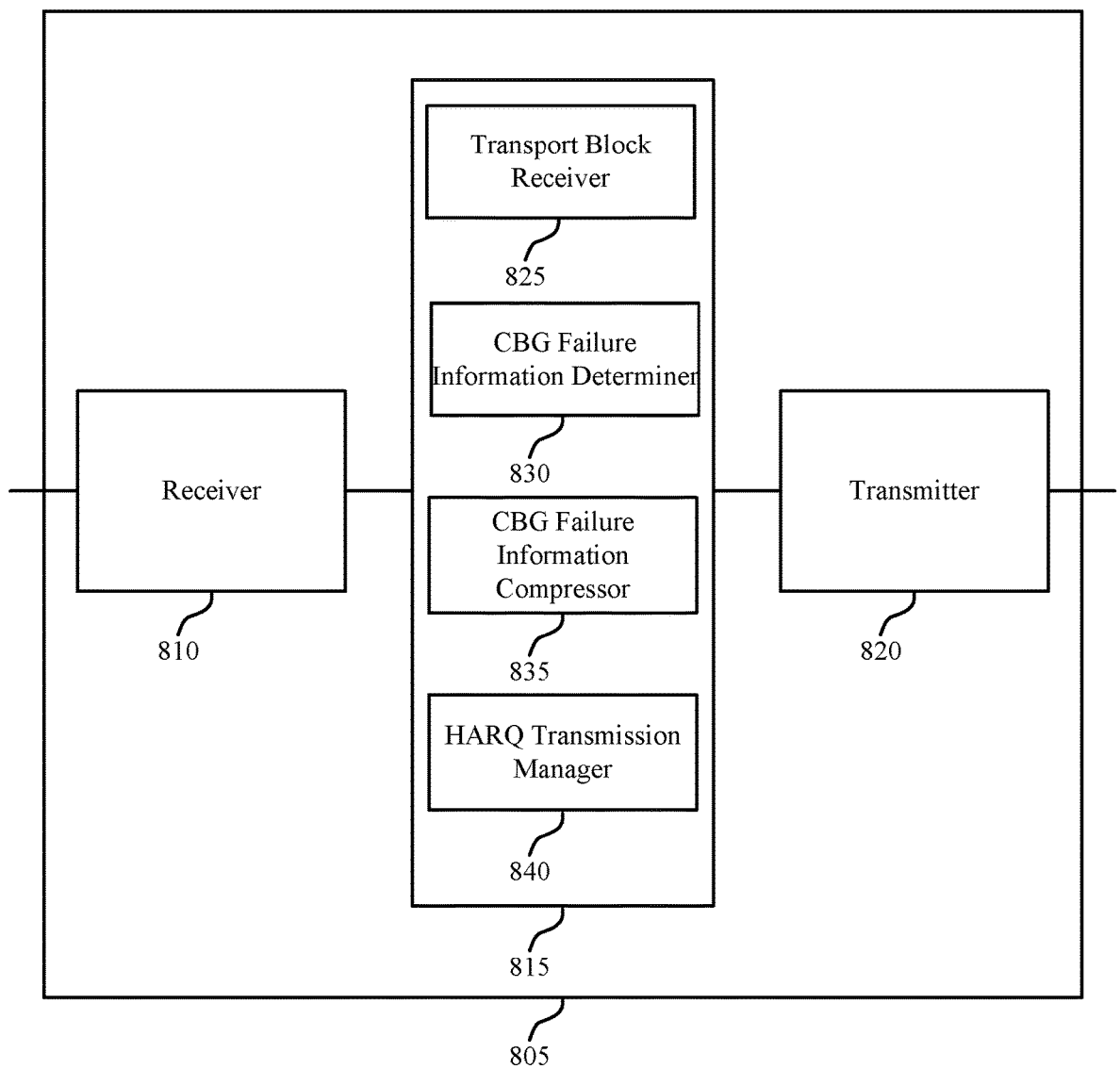
FIG. 8 shows a block diagram of an apparatus for use in wireless communication, in accordance with various aspects of the present disclosure.

FIG. 8 shows a block diagram 800 of an apparatus 805 for use in wireless communication, in accordance with various aspects of the present disclosure. The apparatus 805 may be an example of aspects of one or more of the UEs described with reference to FIGS. 1-3 and 5-7. The apparatus 805 may include a receiver 810, a wireless communication manager 815, and a transmitter 820. The apparatus 805 may also include a processor. Each of these components may be in communication with one another (e.g., via one or more buses).

The receiver 810 may receive data or control signals or information (i.e., transmissions), some or all of which may be associated with various information channels (e.g., data channels, control channels, etc.). Received signals or information, or measurements performed thereon, may be passed to other components of the apparatus 805.

The transmitter 820 may transmit data or control signals or information (i.e., transmissions) generated by other components of the apparatus 805, some or all of which may be associated with various information channels (e.g., data channels, control channels, etc.). In some examples, the transmitter 820 may be collocated with the receiver 810 in a transceiver. For example, the transmitter 820 and receiver 810 may be an example of aspects of the transceiver(s) 1630 described with reference to FIG. 16.

The wireless communication manager 815 and/or at least some of its various sub-components may be implemented in hardware, software executed by a processor, firmware, or any combination thereof. If implemented in software executed by a processor, the functions of the wireless communication manager 815 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The wireless communication manager 815 and/or at least some of its various sub-components may be physically located at various positions, including being distributed such that portions of functions are implemented at different physical locations by one or more physical devices. In some examples, the wireless communication manager 815 and/or at least some of its various sub-components may be a separate and distinct component in accordance with various aspects of the present disclosure. In other examples, the wireless communication manager 815 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The wireless communication manager 815 may include a transport block receiver 825, a CBG failure information determiner 830, a CBG failure information compressor 835, and a HARQ transmission manager 840.

The transport block receiver 825 may be used to receive a TB that includes a plurality of CBGs, as described for example with reference to FIGS. 5 and 6. In some examples, the TB may be part of an eMBB transmission to a UE 805 that includes the apparatus 805, and at least one resource of the eMBB transmission may be punctured by a URLLC associated with a second UE.

The CBG failure information determiner 830 may be used to determine CBG failure information identifying a set of one or more CBGs in the TB that failed to decode at the UE, as described for example with reference to FIGS. 5 and 6.

The CBG failure information compressor 835 may be used to determine a compressed representation of the CBG failure information, as described for example with reference to FIGS. 5 and 6. The compressed representation of the CBG failure information may include fewer bits of information than the CBG failure information determined by the CBG failure information determiner 830.

The HARQ transmission manager 840 may be used to transmit, in response to receiving the TB, HARQ information including the compressed representation of the CBG failure information, as described for example with reference to FIGS. 5 and 6.

Figure 9:
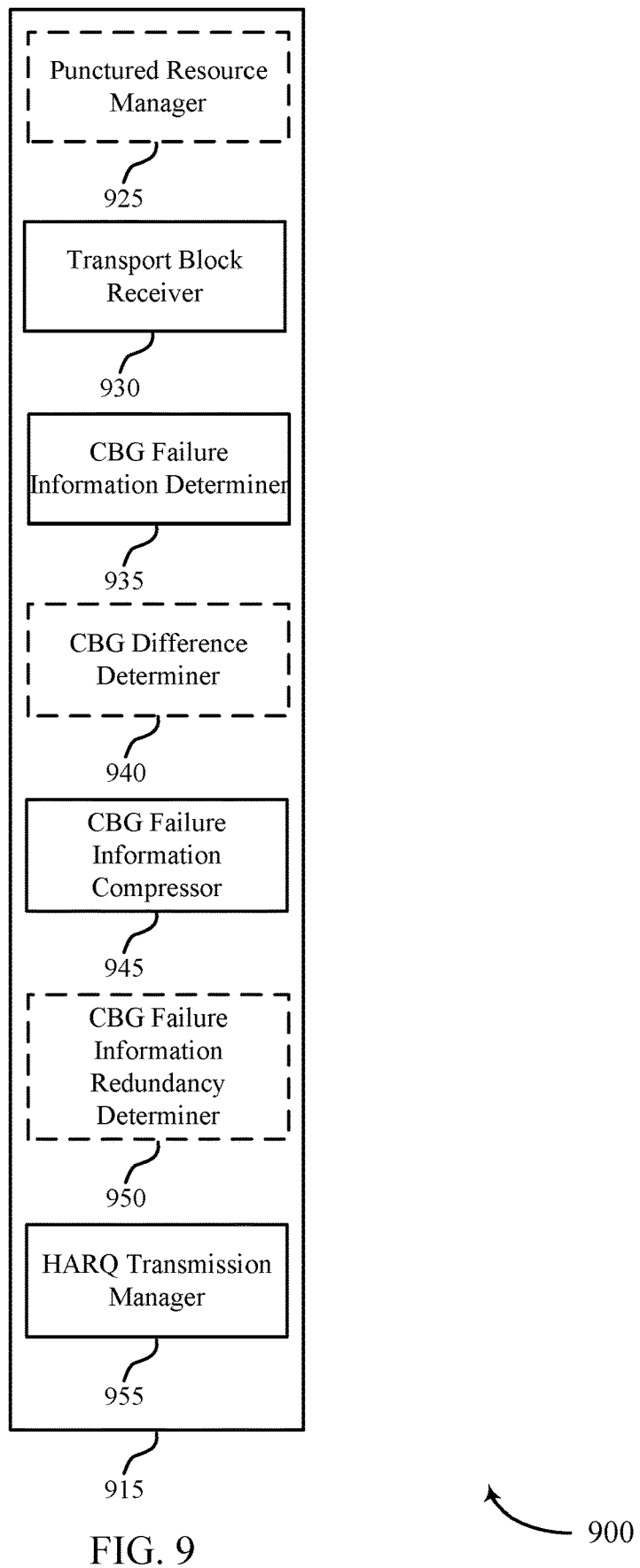
FIG. 9 shows a block diagram of a wireless communication manager, in accordance with various aspects of the present disclosure.

FIG. 9 shows a block diagram 900 of a wireless communication manager 915, in accordance with various aspects of the present disclosure. The wireless communication manager 915 may be an example of aspects of the wireless communication manager described with reference to FIG. 8. The wireless communication manager 915 may include an optional punctured resource manager 925, a transport block receiver 930, a CBG failure information determiner 935, a CBG failure information compressor 940, an optional CBG difference determiner 945, an optional CBG failure information redundancy determiner 950, and a HARQ transmission manager 955. Each of these components may communicate, directly or indirectly, with one another (e.g., via one or more buses). The transport block receiver 930, CBG failure information determiner 935, CBG failure information compressor 940, and HARQ transmission manager 955 may be examples of the transport block receiver 825, CBG failure information determiner 830, CBG failure information compressor 835, and HARQ transmission manager 840 described with reference to FIG. 8.

In a first set of examples of the wireless communication manager 915, the punctured resource manager 925 may be used to receive an indication of punctured resources in a TB that includes a plurality of CBGs, as described for example with reference to FIG. 5. In these examples, the transport block receiver 930 may be used to receive the TB at a UE that includes the wireless communication manager 915, as described for example with reference to FIG. 5. In some examples, the TB may be part of an eMBB transmission to the UE, and at least one resource of the eMBB transmission may be punctured by a URLLC associated with a second UE.

Also in the first set of examples of the wireless communication manager 915, the CBG failure information determiner 935 may be used to determine CBG failure information identifying a set of one or more CBGs in the TB that failed to decode at the UE, as described for example with reference to FIG. 5.

Also in the first set of examples of the wireless communication manager 915, the CBG failure information compressor 940 may be used to determining a compressed representation of the CBG failure information, as described for example with reference to FIG. 5. The compressed representation of the CBG failure information may include fewer bits of information than the CBG failure information determined by the CBG failure information determiner 935. The compressed representation of the CBG failure information may be determined based at least in part on the indication of the punctured resources (received by the punctured resource manager 925). In some examples, determining the compressed representation of the CBG failure information based at least in part on the indication of the punctured resources may include determining a difference between the set of one or more CBGs that failed to decode at the UE and a second set of one or more CBGs that include the punctured resources.

Still further in the first set of examples of the wireless communication manager 915, the CBG difference determiner 945 may be used to identify the difference determined at block 1920, as described for example with reference to FIG. 5. In some examples, the difference between the set of one or more CBGs that failed to decode at the UE and the second set of one or more CBGs that include the punctured resources may be identified based at least in part on the equation $m \log_2 N$, in which m is a number of CBGs in the difference, and N is a total number of CBGs in the TB. In some examples, the difference between the set of one or more CBGs that failed to decode at the UE and the second set of one or more CBGs that include the punctured resources may be identified based at least in part on a starting location and length of at least a first difference between the set of one or more CBGs that failed to decode at the UE and the second set of one or more CBGs that include the punctured resources.

Also in the first set of examples of the wireless communication manager 915, the HARQ transmission manager 955 may be used to transmit, in response to receiving the TB, HARQ information including the compressed representation of the CBG failure information, as described for example with reference to FIG. 5.

In a second set of examples of the wireless communication manager 915, the transport block receiver 930 may be used to receive a TB that includes a plurality of CBGs, as described for example with reference to FIG. 6. In some examples, the TB may be part of an eMBB transmission to a UE that includes the wireless communication manager 915, and at least one resource of the eMBB transmission may be punctured by a URLLC associated with a second UE. In these examples, the CBG failure information determiner 935 may be used to determine CBG failure information identifying a set of one or more CBGs in the TB that failed to decode at the UE, as described for example with reference to FIG. 6.

Also in the second set of examples of the wireless communication manager 915, the CBG failure information compressor 940 may be used to determine a compressed representation of the CBG failure information, as described for example with reference to FIG. 6. Determining the compressed representation of the CBG failure information may include encoding the CBG failure information based at least in part on an encoding scheme known to a device that receives the HARQ information including the compressed representation of the CBG failure information. In some examples, the encoding scheme may be based at least in part on a syndrome matrix, a linear block channel code, a Hamming code, a polar code, or a combination thereof. In some examples, the encoding may be performed based at least in part on a non-receipt, at the UE, of an indication of punctured resources in the TB. The compressed representation of the CBG failure information may include fewer bits of information than the CBG failure information determined by the CBG failure information determiner 935.

Also in the second set of examples of the wireless communication manager 915, the CBG failure information redundancy determiner 950 may be used to determine redundancy information for the encoded CBG failure information, as described for example with reference to FIG. 6.

Still further in the second set of examples of the wireless communication manager 915, the HARQ transmission manager 955 may be used to transmit, in response to receiving the TB, HARQ information including the compressed representation of the CBG failure information, as described for example with reference to FIG. 6. In some examples, transmitting the HARQ information including the compressed representation of the CBG failure information may include transmitting at least a portion of the encoded CBG failure information. In some examples, transmitting the HARQ information including the compressed representation of the CBG failure information may include transmitting at least the portion of the encoded CBG failure information with at least a portion of the redundancy information.

Figure 10:
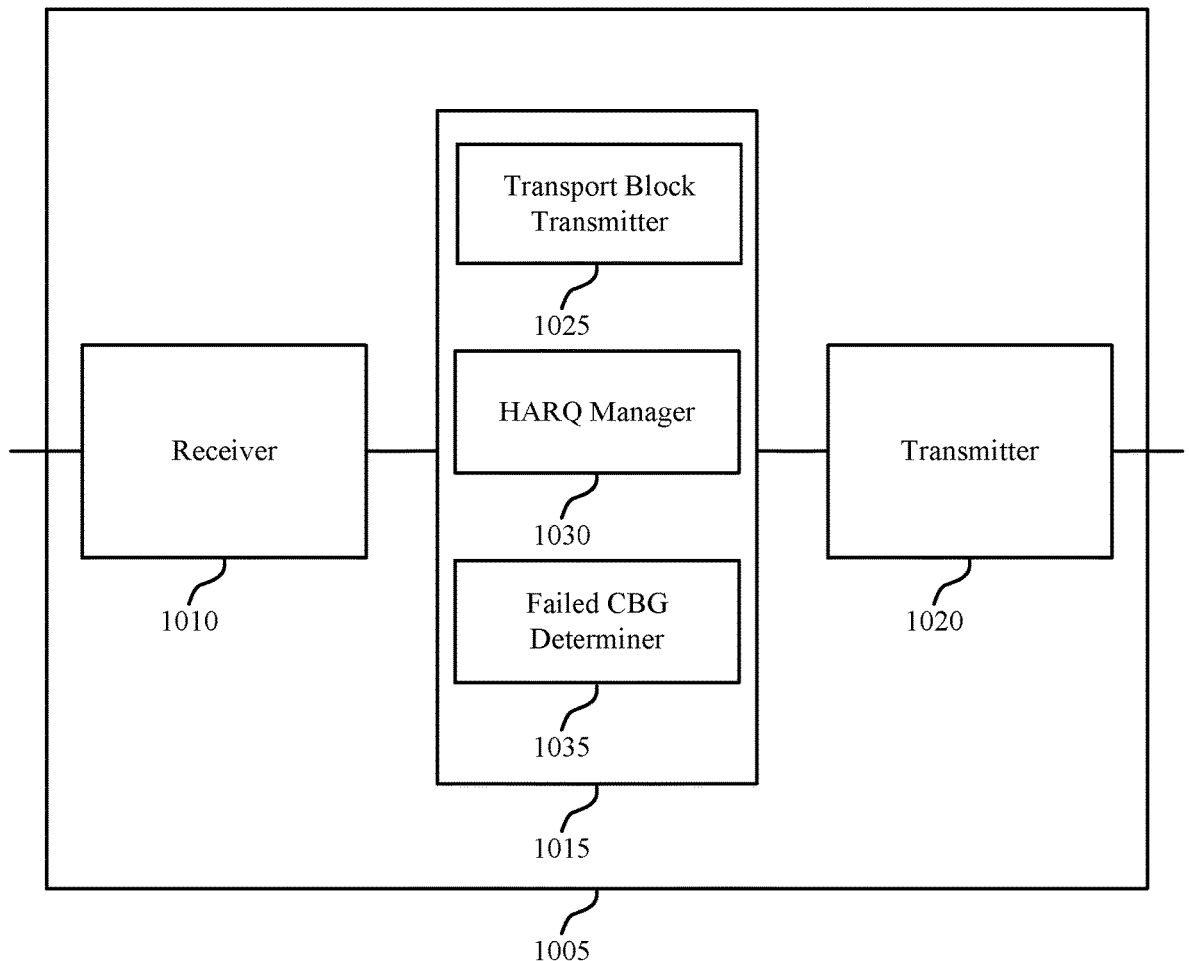
FIG. 10 shows a block diagram of an apparatus for use in wireless communication, in accordance with various aspects of the present disclosure.

FIG. 10 shows a block diagram 1000 of an apparatus 1005 for use in wireless communication, in accordance with various aspects of the present disclosure. The apparatus 1005 may be an example of aspects of one or more of the base stations described with reference to FIGS. 1-3 and 5-7. The apparatus 1005 may include a receiver 1010, a wireless communication manager 1015, and a transmitter 1020. The apparatus 1005 may also include a processor. Each of these components may be in communication with one another (e.g., via one or more buses).

The receiver 1010 may receive data or control signals or information (i.e., transmissions), some or all of which may be associated with various information channels (e.g., data channels, control channels, etc.). Received signals or information, or measurements performed thereon, may be passed to other components of the apparatus 1005.

The transmitter 1020 may transmit data or control signals or information (i.e., transmissions) generated by other components of the apparatus 1005, some or all of which may be associated with various information channels (e.g., data channels, control channels, etc.). In some examples, the transmitter 1020 may be collocated with the receiver 1010 in a transceiver. For example, the transmitter 1020 and receiver 1010 may be an example of aspects of the transceiver(s) 1750 described with reference to FIG. 17.

The wireless communication manager 1015 and/or at least some of its various sub-components may be implemented in hardware, software executed by a processor, firmware, or any combination thereof. If implemented in software executed by a processor, the functions of the wireless communication manager 1015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure.

The wireless communication manager 1015 and/or at least some of its various sub-components may be physically located at various positions, including being distributed such that portions of functions are implemented at different physical locations by one or more physical devices. In some examples, the wireless communication manager 1015 and/or at least some of its various sub-components may be a separate and distinct component in accordance with various aspects of the present disclosure. In other examples, the wireless communication manager 1015 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The wireless communication manager 1015 may include a transport block transmitter 1025, a HARQ manager 1030, and a failed CBG determiner 1035.

The transport block transmitter 1025 may be used to transmit, to a UE, a TB that includes a plurality of CBGs, as described for example with reference to FIGS. 5 and 6. In some examples, the TB may be part of an eMBB transmission to the UE, and at least one resource of the eMBB transmission is punctured by a URLLC associated with a second UE.

The HARQ manager 1030 may be used to receive from the UE, in response to transmitting the TB, HARQ information including a compressed representation of CBG failure information, as described for example with reference to FIGS. 5 and 6. The compressed representation of the CBG failure information may identify a set of one or more CBGs in the TB that failed to decode at the UE.

The failed CBG determiner 1035 may be used to determine, based at least in part on the compressed representation of the CBG failure information and a known puncturing of at least one CBG of the TB, a set of one or more CBGs in the TB to retransmit to the UE, as described for example with reference to FIGS. 5 and 6.

Figure 11:
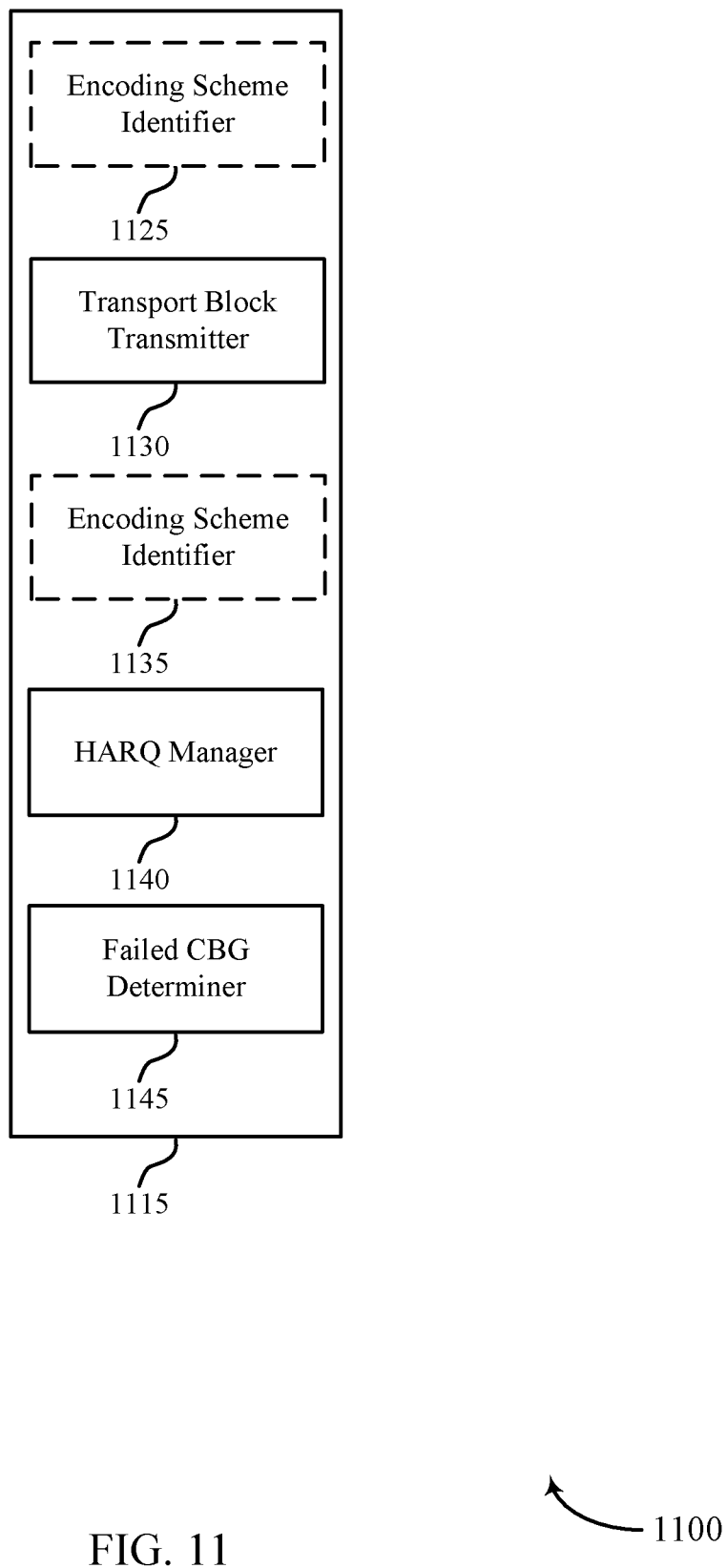
FIG. 11 shows a block diagram of a wireless communication manager, in accordance with various aspects of the present disclosure.

FIG. 11 shows a block diagram 1100 of a wireless communication manager 1115, in accordance with various aspects of the present disclosure. The wireless communication manager 1115 may be an example of aspects of the wireless communication manager described with reference to FIG. 10. The wireless communication manager 1115 may include an optional punctured resource identifier 1125, a transport block transmitter 1130, an optional encoding scheme identifier 1135, a HARQ manager 1140, and a failed CBG determiner 1145. Each of these components may communicate, directly or indirectly, with one another (e.g., via one or more buses). The transport block transmitter 1130, HARQ manager 1140, and failed CBG determiner 1145 may be examples of the transport block transmitter 1025, HARQ manager 1030, and failed CBG determiner 1035 described with reference to FIG. 10.

In a first set of examples of the wireless communication manager 1115, the punctured resource identifier 1125 may be used to transmit, to a UE, an indication of punctured resources in a TB, as described for example with reference to FIG. 5. In these examples, the transport block transmitter 1130 may be used to transmit, to the UE, the TB. The TB may include a plurality of CBGs, as described for example with reference to FIG. 5. In some examples, the TB may be part of an eMBB transmission to the UE, and at least one resource of the eMBB transmission is punctured by a URLLC associated with a second UE.

Also in the first set of examples of the wireless communication manager 1115, the HARQ manager 1140 may be used to receive from the UE, in response to transmitting the TB, HARQ information including a compressed representation of CBG failure information, as described for example with reference to FIG. 5. The compressed representation of the CBG failure information may identify a set of one or more CBGs in the TB that failed to decode at the UE. The compressed representation of the CBG failure information may be based at least in part on the indication of the punctured resources. In some examples, the compressed representation of the CBG failure information may include an indication of a difference between the set of one or more CBGs that failed to decode at the UE and a second set of one or more CBGs that include the punctured resources. In some examples, the difference between the set of one or more CBGs that failed to decode at the UE and the second set of one or more CBGs that include the punctured resources may be based at least in part on an equation $m \log_2 N$, wherein m is a number of CBGs in the difference, and N is a total number of CBGs in the TB. In some examples, the indication of the difference between the set of one or more CBGs that failed to decode at the UE and the second set of one or more CBGs that include the punctured resources may be based at least in part on a starting location and length of at least a first difference between the set of one or more CBGs that failed to decode at the UE and the second set of one or more CBGs that include the punctured resources.

Also in the first set of examples of the wireless communication manager 1115, the failed CBG determiner 1145 may be used to determine, based at least in part on the compressed representation of the CBG failure information and a known puncturing of at least one CBG of the TB, a set of one or more CBGs in the TB to retransmit to the UE, as described for example with reference to FIG. 5. In some examples, determining the set of one or more CBGs to retransmit to the UE may include combining the second set of one or more CBGs that include the punctured resources with a third set of one or more CBGs identified by the difference between the set of one or more CBGs that failed to decode at the UE and the second set of one or more CBGs that include the punctured resources.

In a second set of examples of the wireless communication manager 1115, the transport block transmitter 1130 may be used to transmit, to a UE, a TB that includes a plurality of CBGs, as described for example with reference to FIG. 6. In some examples, the TB may be part of an eMBB transmission to the UE, and at least one resource of the eMBB transmission is punctured by a URLLC associated with a second UE. In these examples, the encoding scheme identifier 1135 may be used to identify an encoding scheme known by the UE, as described for example with reference to FIG. 6. In some examples, the encoding scheme may be based at least in part on a syndrome matrix, a linear block channel code, a Hamming code, a polar code, or a combination thereof.

Also in the second set of examples of the wireless communication manager 1115, the HARQ manager 1140 may be used to receive from the UE, in response to transmitting the TB, HARQ information including a compressed representation of CBG failure information, as described for example with reference to FIG. 6. The compressed representation of the CBG failure information may identify a set of one or more CBGs in the TB that failed to decode at the UE. The compressed representation of the CBG failure information may include the CBG failure information encoded based at least in part on the encoding scheme. In some examples, the encoded CBG failure information may be received with redundancy information for the encoded CBG failure information. The redundancy information may be based at least in part on the encoding scheme.

Also in the second set of examples of the wireless communication manager 1115, the failed CBG determiner 1145 may be used to determine, based at least in part on the compressed representation of the CBG failure information and a known puncturing of at least one CBG of the TB, a set of one or more CBGs in the TB to retransmit to the UE, as described for example with reference to FIG. 6. In some examples, determining the set of one or more CBGs to retransmit to the UE may include decoding the encoded CBG failure information based at least in part on the encoding scheme.

Figure 12:
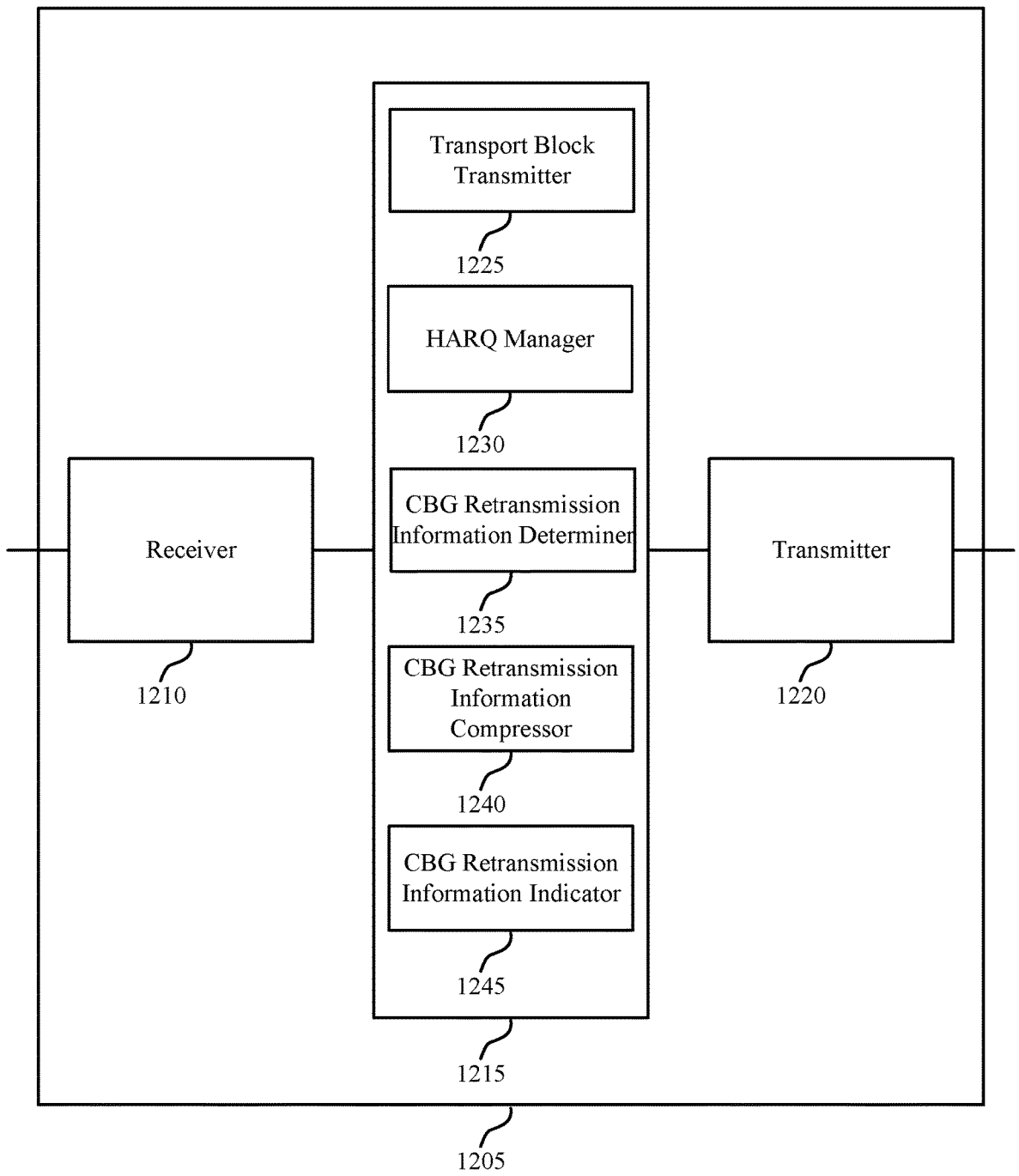
FIG. 12 shows a block diagram of an apparatus for use in wireless communication, in accordance with various aspects of the present disclosure.

FIG. 12 shows a block diagram 1200 of an apparatus 1205 for use in wireless communication, in accordance with various aspects of the present disclosure. The apparatus 1205 may be an example of aspects of one or more of the base stations described with reference to FIGS. 1-3 and 5-7. The apparatus 1205 may include a receiver 1210, a wireless communication manager 1215, and a transmitter 1220. The apparatus 1205 may also include a processor. Each of these components may be in communication with one another (e.g., via one or more buses).

The receiver 1210 may receive data or control signals or information (i.e., transmissions), some or all of which may be associated with various information channels (e.g., data channels, control channels, etc.). Received signals or information, or measurements performed thereon, may be passed to other components of the apparatus 1205.

The transmitter 1220 may transmit data or control signals or information (i.e., transmissions) generated by other components of the apparatus 1205, some or all of which may be associated with various information channels (e.g., data channels, control channels, etc.). In some examples, the transmitter 1220 may be collocated with the receiver 1210 in a transceiver. For example, the transmitter 1220 and receiver 1210 may be an example of aspects of the transceiver(s) 1750 described with reference to FIG. 17.

The wireless communication manager 1215 and/or at least some of its various sub-components may be implemented in hardware, software executed by a processor, firmware, or any combination thereof. If implemented in software executed by a processor, the functions of the wireless communication manager 1215 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure.

The wireless communication manager 1215 and/or at least some of its various sub-components may be physically located at various positions, including being distributed such that portions of functions are implemented at different physical locations by one or more physical devices. In some examples, the wireless communication manager 1215 and/or at least some of its various sub-components may be a separate and distinct component in accordance with various aspects of the present disclosure. In other examples, the wireless communication manager 1215 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The wireless communication manager 1215 may include a transport block transmitter 1225, a HARQ manager 1230, a CBG retransmission information determiner 1235, a CBG retransmission information compressor 1240, and a CBG retransmission information indicator 1245.

The transport block transmitter 1225 may be used to transmit, to a UE, a TB that includes a plurality of CBGs, as described for example with reference to FIG. 7. In some examples, the TB may be part of an eMBB transmission to the UE, and at least one resource of the eMBB transmission is punctured by a URLLC associated with a second UE.

The HARQ manager 1230 may be used to receive from the UE, in response to transmitting the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information.

The CBG retransmission information determiner 1235 may be used to determine, based at least in part on the representation of the CBG failure information, CBG retransmission information identifying a set of one or more CBGs in the TB to retransmit to the UE, as described for example with reference to FIG. 7.

The CBG retransmission information compressor 1240 may be used to determine a compressed indication of the set of one or more CBGs to retransmit to the UE, as described for example with reference to FIG. 7. The compressed indication may include fewer bits of information than the CBG retransmission information.

The CBG retransmission information indicator 1245 may be used to transmit to the UE, in response to receiving the HARQ information, the compressed indication of the CBG retransmission information, as described for example with reference to FIG. 7.

Figure 13:
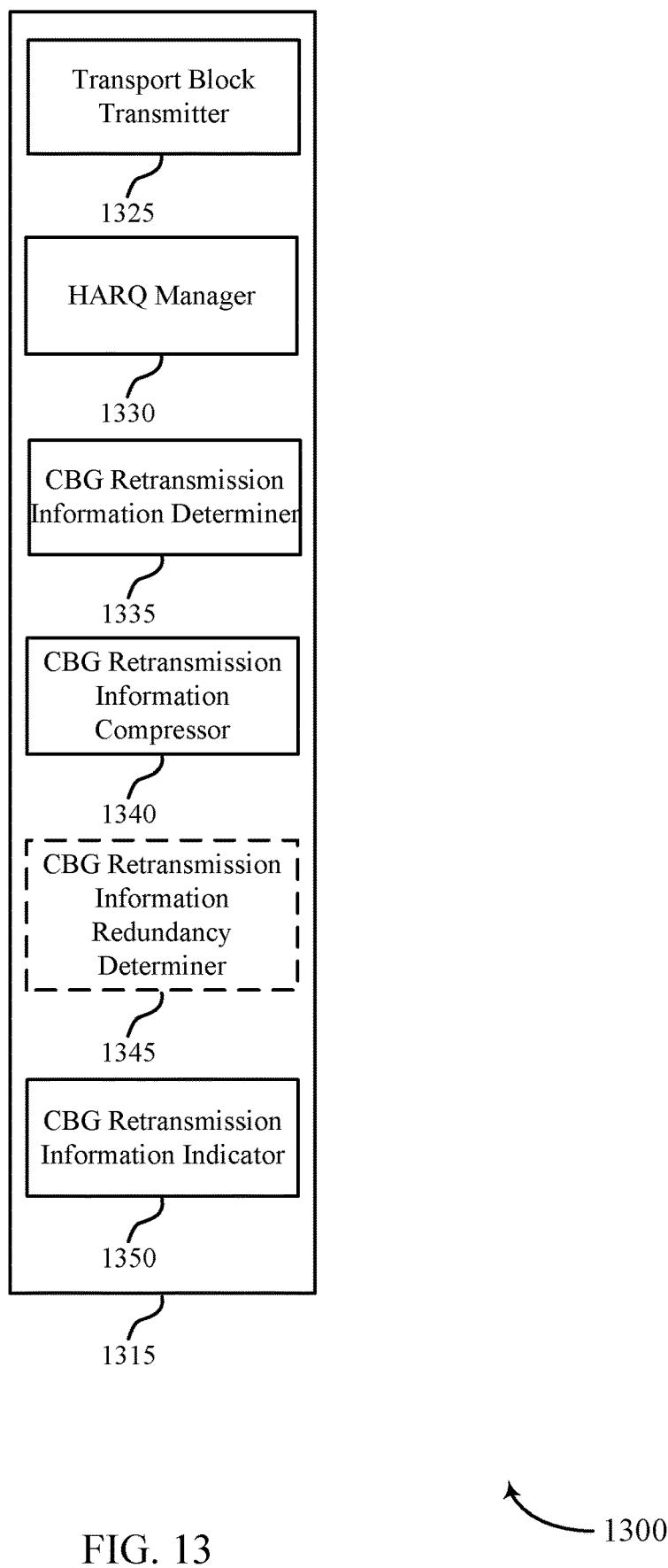
FIG. 13 shows a block diagram of a wireless communication manager, in accordance with various aspects of the present disclosure.

FIG. 13 shows a block diagram 1300 of a wireless communication manager 1315, in accordance with various aspects of the present disclosure. The wireless communication manager 1315 may be an example of aspects of the wireless communication manager described with reference to FIG. 12. The wireless communication manager 1315 may include a transport block transmitter 1325, a HARQ manager 1330, a CBG retransmission information determiner 1335, a CBG retransmission information compressor 1340, an optional CBG retransmission information redundancy determiner 1345, and a CBG retransmission information indicator 1350. Each of these components may communicate, directly or indirectly, with one another (e.g., via one or more buses). The transport block transmitter 1325, HARQ manager 1330, CBG retransmission information determiner 1335, CBG retransmission information compressor 1340, and CBG retransmission information indicator 1350 may be examples of the transport block transmitter 1225, HARQ manager 1230, CBG retransmission information determiner 1235, CBG retransmission information compressor 1240, and CBG retransmission information indicator 1245 described with reference to FIG. 10.

The transport block transmitter 1325 may be used to transmit, to a UE, a TB that includes a plurality of CBGs, as described for example with reference to FIG. 7. In some examples, the TB may be part of an eMBB transmission to the UE, and at least one resource of the eMBB transmission is punctured by a URLLC associated with a second UE.

The HARQ manager 1330 may be used to receive from the UE, in response to transmitting the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be received in UCI.

The CBG retransmission information determiner 1335 may be used to determine, based at least in part on the representation of the CBG failure information, CBG retransmission information identifying a set of one or more CBGs in the TB to retransmit to the UE, as described for example with reference to FIG. 7.

The CBG retransmission information compressor 1340 may be used to determine a compressed indication of the set of one or more CBGs to retransmit to the UE, as described for example with reference to FIG. 7. The compressed indication may include fewer bits of information than the CBG retransmission information. In some examples, determining the compressed indication of the CBG retransmission information may include encoding the CBG retransmission information based at least in part on an encoding scheme known to the UE. In some examples, the encoding scheme may be based at least in part on a syndrome matrix, a linear block channel code, a Hamming code, a polar code, or a combination thereof. In some examples, determining the compressed indication of the CBG retransmission information may include scrambling, based at least in part on the CBG retransmission information, a CRC of DCI transmitted to the UE. In some examples, determining the compressed indication of the CBG retransmission information may include generating a CRC for DCI transmitted to the UE, with the CRC being generated based at least in part on the DCI and the CBG retransmission information.

The CBG retransmission information redundancy determiner 1345 may be used to determine redundancy information for the encoded CBG retransmission information, as described for example with reference to FIG. 7.

The CBG retransmission information indicator 1350 may be used to transmit to the UE, in response to receiving the HARQ information, the compressed indication of the CBG retransmission information, as described for example with reference to FIG. 7. In some examples, transmitting the compressed indication of the CBG retransmission information may include transmitting at least a portion of the encoded CBG retransmission information. In some examples, transmitting the compressed indication of the CBG retransmission information may include transmitting at least the portion of the encoded CBG retransmission information with at least a portion of the redundancy information. In some examples, the compressed indication of the CBG retransmission information may be transmitted in DCI transmitted with the set of one or more CBGs to retransmit to the UE.

Figure 14:
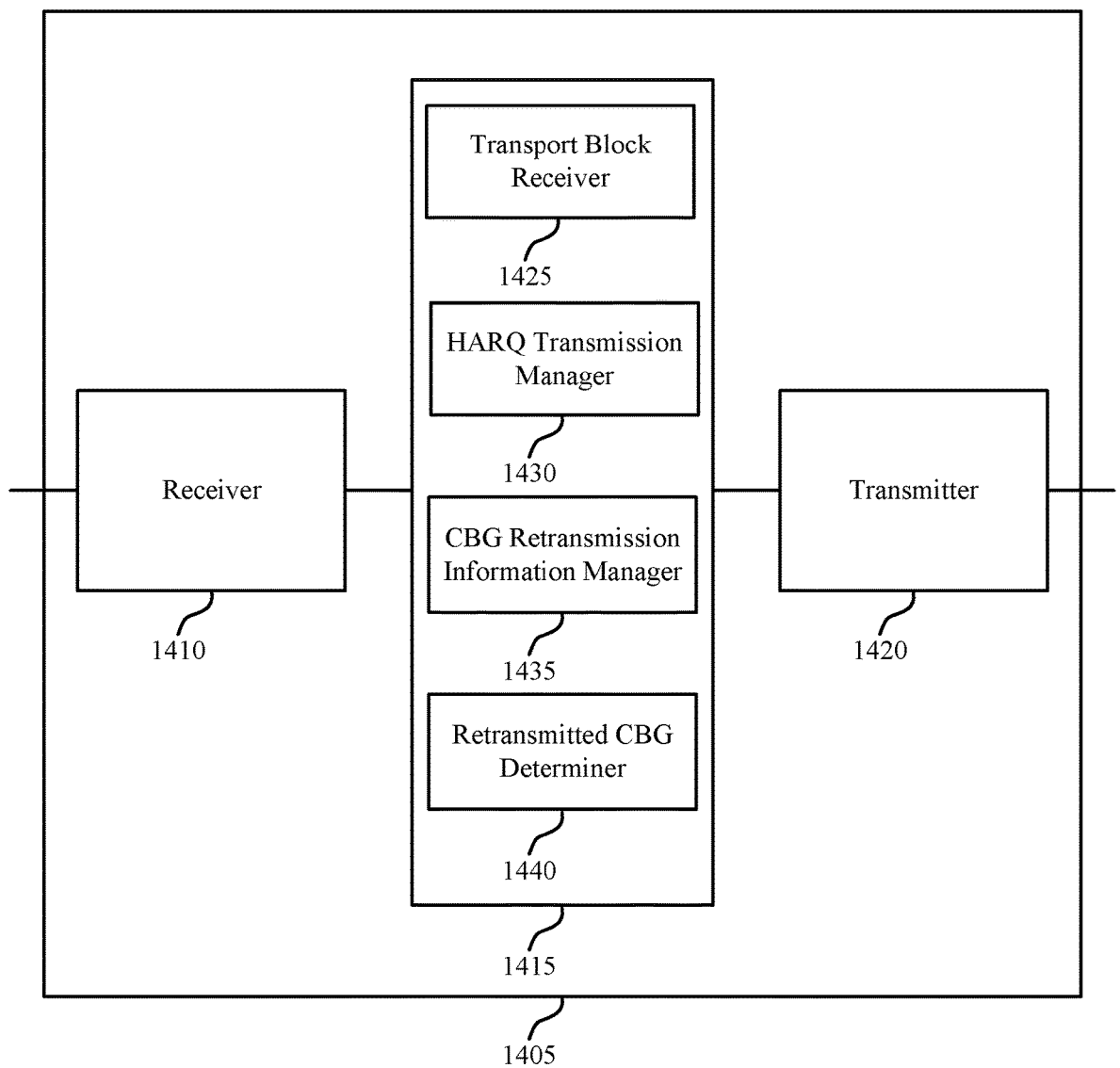
FIG. 14 shows a block diagram of an apparatus for use in wireless communication, in accordance with various aspects of the present disclosure.

FIG. 14 shows a block diagram 1400 of an apparatus 1405 for use in wireless communication, in accordance with various aspects of the present disclosure. The apparatus 1405 may be an example of aspects of a UE described with reference to FIGS. 1-3 and 5-7. The apparatus 1405 may include a receiver 1410, a wireless communication manager 1415, and a transmitter 1420. The apparatus 1405 may also include a processor. Each of these components may be in communication with one another (e.g., via one or more buses).

The receiver 1410 may receive data or control signals or information (i.e., transmissions), some or all of which may be associated with various information channels (e.g., data channels, control channels, etc.). Received signals or information, or measurements performed thereon, may be passed to other components of the apparatus 1405.

The transmitter 1420 may transmit data or control signals or information (i.e., transmissions) generated by other components of the apparatus 1405, some or all of which may be associated with various information channels (e.g., data channels, control channels, etc.). In some examples, the transmitter 1420 may be collocated with the receiver 1410 in a transceiver. For example, the transmitter 1420 and receiver 1410 may be an example of aspects of the transceiver(s) 1630 described with reference to FIG. 16.

The wireless communication manager 1415 and/or at least some of its various sub-components may be implemented in hardware, software executed by a processor, firmware, or any combination thereof. If implemented in software executed by a processor, the functions of the wireless communication manager 1415 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure.

The wireless communication manager 1415 and/or at least some of its various sub-components may be physically located at various positions, including being distributed such that portions of functions are implemented at different physical locations by one or more physical devices. In some examples, the wireless communication manager 1415 and/or at least some of its various sub-components may be a separate and distinct component in accordance with various aspects of the present disclosure. In other examples, the wireless communication manager 1415 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The wireless communication manager 1415 may include a transport block receiver 1425, a HARQ transmission manager 1430, a CBG retransmission information manager 1435, and a retransmitted CBG determiner 1440.

The transport block receiver 1425 may be used to receive a TB that includes a plurality of CBGs, as described for example with reference to FIG. 7. In some examples, the TB may be part of an eMBB transmission to a UE that includes the apparatus 1405, and at least one resource of the eMBB transmission may be punctured by a URLLC associated with a second UE.

The HARQ transmission manager 1430 may be used to transmit, in response to receiving the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be transmitted in UCI.

The CBG retransmission information manager 1435 may be used to receive, at the UE, a compressed indication of CBG retransmission information, as described for example with reference to FIG. 7. In some examples, the compressed indication of the CBG retransmission information is received in DCI.

The retransmitted CBG determiner 1440 may be used to determine, based at least in part on the compressed indication of the CBG retransmission information and the first set of one or more CBGs in the TB that failed to decode at the UE, a second set of one or more CBGs that is to be retransmitted to the UE, as described for example with reference to FIG. 7.

Figure 15:
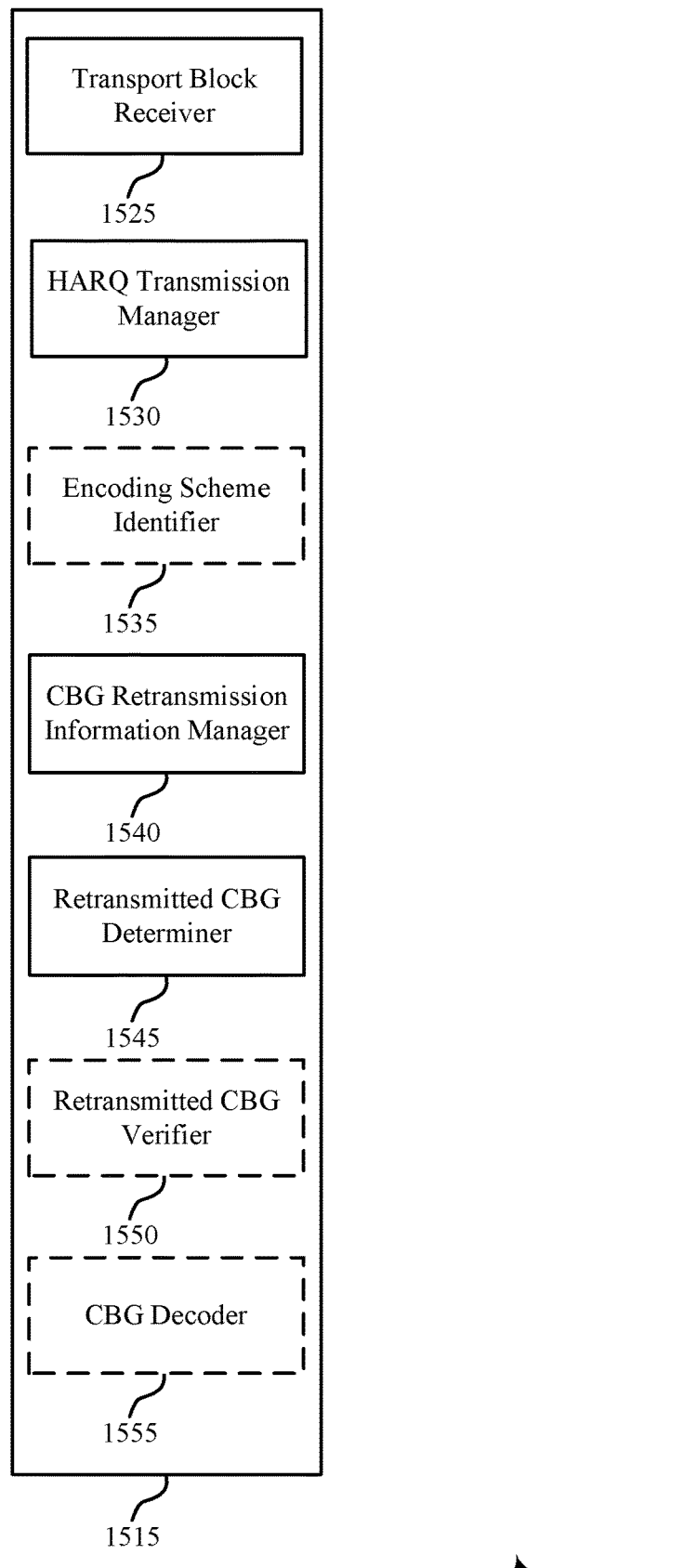
FIG. 15 shows a block diagram of a wireless communication manager, in accordance with various aspects of the present disclosure.

FIG. 15 shows a block diagram 1500 of a wireless communication manager 1515, in accordance with various aspects of the present disclosure. The wireless communication manager 1515 may be an example of aspects of the wireless communication manager described with reference to FIG. 14. The wireless communication manager 1515 may include a transport block receiver 1525, a HARQ transmission manager 1530, an optional encoding scheme identifier 1535, a CBG retransmission information manager 1540, a retransmitted CBG determiner 1545, an optional retransmitted CBG verifier 1550, and an optional CBG decoder 1555. Each of these components may communicate, directly or indirectly, with one another (e.g., via one or more buses). The transport block receiver 1525, HARQ transmission manager 1530, CBG retransmission information manager 1540, and retransmitted CBG determiner 1545 may be examples of the transport block receiver 1425, HARQ transmission manager 1430, CBG retransmission information manager 1435, and retransmitted CBG determiner 1440 described with reference to FIG. 14.

The transport block receiver 1525 may be used to receive, at a UE, a TB that includes a plurality of CBGs, as described for example with reference to FIG. 7. In some examples, the TB may be part of an eMBB transmission to the UE, and at least one resource of the eMBB transmission may be punctured by a URLLC associated with a second UE.

The HARQ transmission manager 1530 may be used to transmit, in response to receiving the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be transmitted in UCI.

The encoding scheme identifier 1535 may be used to identify an encoding scheme known by a device that transmits the compressed indication of the CBG retransmission information. In some examples, the encoding scheme may be based at least in part on a syndrome matrix, a linear block channel code, a Hamming code, a polar code, or a combination thereof.

The CBG retransmission information manager 1540 may be used to receive, at the UE, a compressed indication of CBG retransmission information, as described for example with reference to FIG. 7. In some examples, the compressed indication of the CBG retransmission information may include the CBG retransmission information encoded based at least in part on the encoding scheme. In some examples, the encoded CBG retransmission information may be received with redundancy information for the encoded CBG retransmission information. The redundancy information may be based at least in part on the encoding scheme. In some examples, the compressed indication of the CBG retransmission information may be received in DCI associated with the second set of one or more CBGs. In some examples, receiving the compressed indication of the CBG retransmission information may include receiving DCI having a CRC scrambled based at least in part on the CBG retransmission information. In some examples, receiving the compressed indication of the CBG retransmission information may include receiving DCI having a CRC generated based at least in part on the DCI and the CBG retransmission information.

The retransmitted CBG determiner 1545 may be used to determine, based at least in part on the compressed indication of the CBG retransmission information and the first set of one or more CBGs in the TB that failed to decode at the UE, a second set of one or more CBGs that is to be retransmitted to the UE, as described for example with reference to FIG. 7. In some examples, determining the second set of one or more CBGs that is to be retransmitted to the UE may include decoding the encoded CBG retransmission information based at least in part on the encoding scheme.

The retransmitted CBG verifier 1550 may be used to compare the second set of one or more CBGs to be retransmitted to the UE to the first set of one or more CBGs in the TB, as described for example with reference to FIG. 7. The retransmitted CBG verifier 1550 may also be used to determine whether the first set of one or more CBGs in the TB matches the second set of one or more CBGs to be retransmitted to the UE, as also described for example with reference to FIG. 7.

When the CBG verifier 1550 identifies at least one CBG in the first set of one or more CBGs in the TB, which at least one CBG is included in the second set of one or more CBGs to be retransmitted to the UE, the CBG decoder 1555 may be used to decode the identified at least one CBG, as described for example with reference to FIG. 7.

When the CBG verifier 1550 identifies at least one CBG in the first set of one or more CBGs in the TB, which at least one CBG is not included in the second set of one or more CBGs to be retransmitted to the UE, the HARQ transmission manager 1530 may be used to transmit a retransmission request for the identified at least one CBG.

Figure 16:
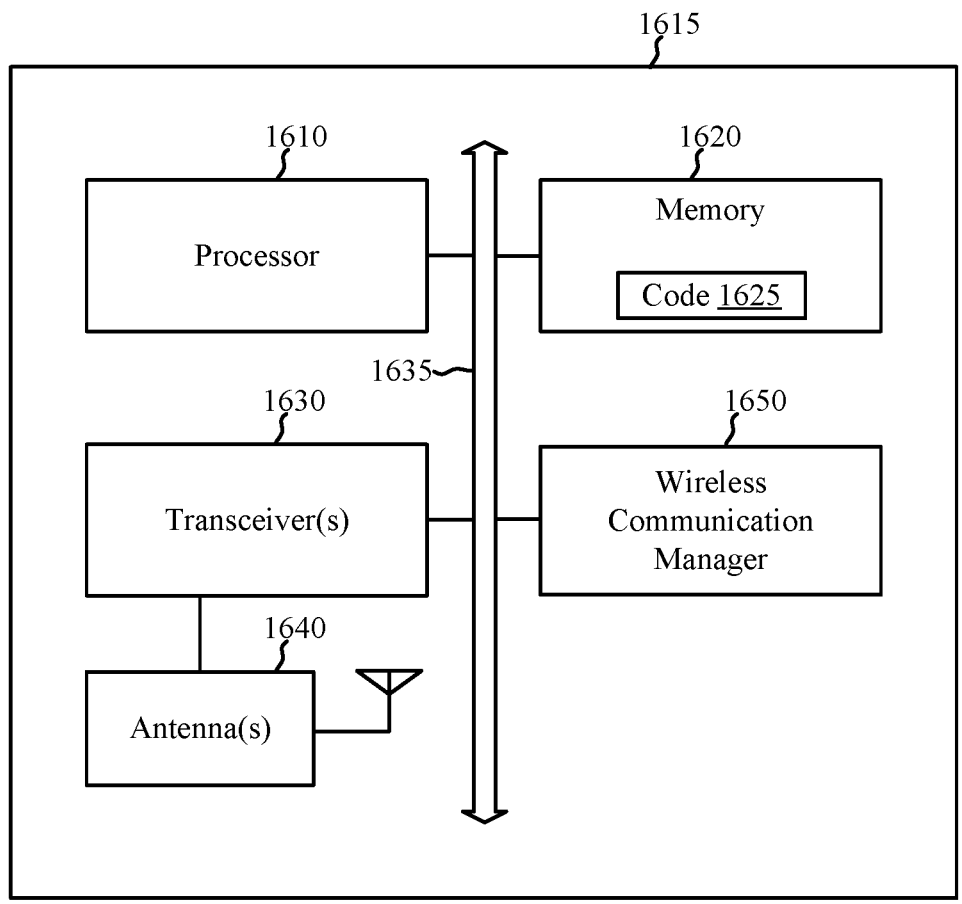
FIG. 16 shows a block diagram of a UE for use in wireless communication, in accordance with various aspects of the present disclosure.

FIG. 16 shows a block diagram 1600 of a UE 1615 for use in wireless communication, in accordance with various aspects of the present disclosure. The UE 1615 may be included or be part of a personal computer (e.g., a laptop computer, a netbook computer, a tablet computer, etc.), a cellular telephone, a PDA, a digital video recorder (DVR), an internet appliance, a gaming console, an e-reader, a vehicle, a home appliance, a lighting or alarm control system, etc. The UE 1615 may, in some examples, have an internal power supply (not shown), such as a small battery, to facilitate mobile operation. In some examples, the UE 1615 may be an example of aspects of one or more of the UEs described with reference to FIGS. 1-3 and 5-7, or aspects of the apparatus described with reference to FIGS. 10-13. The UE 1615 may be configured to implement at least some of the UE or apparatus techniques or functions described with reference to FIGS. 1-9, 14, and 15.

The UE 1615 may include a processor 1610, a memory 1620, at least one transceiver (represented by transceiver(s) 1630), antennas 1640 (e.g., an antenna array), or a wireless communication manager 1650. Each of these components may be in communication with each other, directly or indirectly, over one or more buses 1635.

The memory 1620 may include random access memory (RAM) or read-only memory (ROM). The memory 1620 may store computer-readable, computer-executable code 1625 containing instructions that are configured to, when executed, cause the processor 1610 to perform various functions described herein related to wireless communication, including, for example, managing HARQ processes and receiving retransmissions of CBGs. Alternatively, the computer-executable code 1625 may not be directly executable by the processor 1610 but be configured to cause the UE 1615 (e.g., when compiled and executed) to perform various of the functions described herein.

The processor 1610 may include an intelligent hardware device, e.g., a central processing unit (CPU), a microcontroller, an ASIC, etc. The processor 1610 may process information received through the transceiver(s) 1630 or information to be sent to the transceiver(s) 1630 for transmission through the antennas 1640. The processor 1610 may handle, alone or in connection with the wireless communication manager 1650, one or more aspects of communicating over (or managing communications over) one or more radio frequency spectrum bands.

The transceiver(s) 1630 may include a modem configured to modulate packets and provide the modulated packets to the antennas 1640 for transmission, and to demodulate packets received from the antennas 1640. The transceiver(s) 1630 may, in some examples, be implemented as one or more transmitters and one or more separate receivers. The transceiver(s) 1630 may support communications in one or more radio frequency spectrum bands. The transceiver(s) 1630 may be configured to communicate bi-directionally, via the antennas 1640, with one or more base stations or apparatuses, such as one or more of the base stations or apparatuses described with reference to FIGS. 1-3, 5-7, and 10-13.

The wireless communication manager 1650 may be configured to perform or control some or all of the UE or apparatus techniques or functions described with reference to FIGS. 1-9. The wireless communication manager 1650, or portions of it, may include a processor, or some or all of the functions of the wireless communication manager 1650 may be performed by the processor 1610 or in connection with the processor 1610. In some examples, the wireless communication manager 1650 may be an example of aspects of one or more of the wireless communication managers described with reference to FIGS. 8, 9, 14, and 15.

Figure 17:
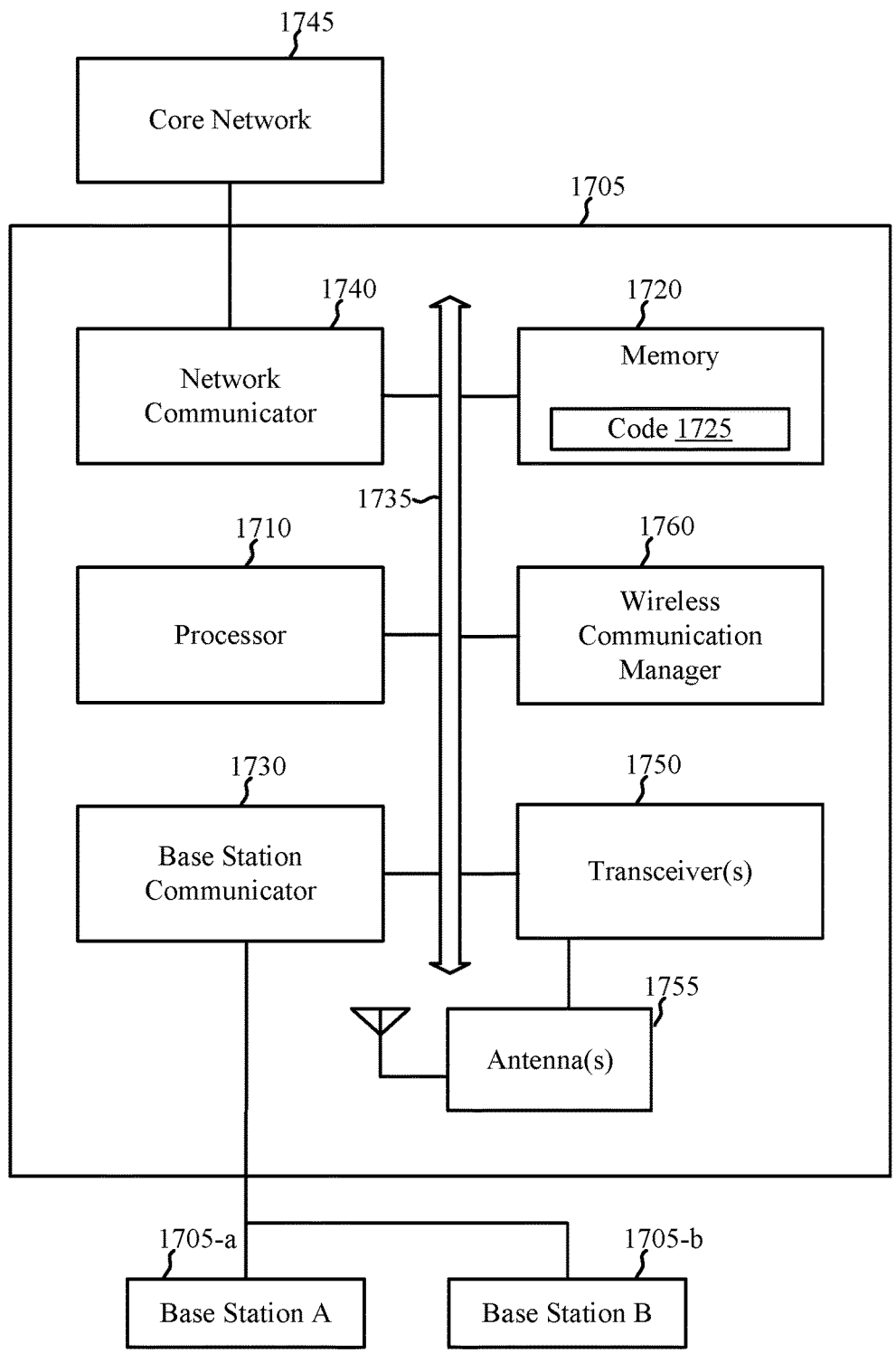
FIG. 17 shows a block diagram of a base station for use in wireless communication, in accordance with various aspects of the present disclosure.

FIG. 17 shows a block diagram 1700 of a base station 1705 for use in wireless communication, in accordance with various aspects of the present disclosure. In some examples, the base station 1705 may be an example of one or more aspects of the base stations described with reference to FIGS. 1-3 and 5-7. The base station 1705 may be configured to implement or facilitate at least some of the base station or apparatus techniques or functions described with reference to FIGS. 1-7 and 10-13.

The base station 1705 may include a processor 1710, a memory 1720, at least one transceiver (represented by transceiver(s) 1750), at least one antenna 1755 (e.g., an antenna array), or a wireless communication manager 1760. The base station 1705 may also include one or more of a base station communicator 1730 or a network communicator 1740. Each of these components may be in communication with each other, directly or indirectly, over one or more buses 1735.

The memory 1720 may include RAM or ROM. The memory 1720 may store computer-readable, computer-executable code 1725 containing instructions that are configured to, when executed, cause the processor 1710 to perform various functions described herein related to wireless communication, including, for example, managing HARQ processes and retransmissions of CBGs to UEs. Alternatively, the computer-executable code 1725 may not be directly executable by the processor 1710 but be configured to cause the base station 1705 (e.g., when compiled and executed) to perform various of the functions described herein.

The processor 1710 may include an intelligent hardware device, e.g., a CPU, a microcontroller, an ASIC, etc. The processor 1710 may process information received through the transceiver(s) 1750, the base station communicator 1730, or the network communicator 1740. The processor 1710 may also process information to be sent to the transceiver(s) 1750 for transmission through the antennas 1755, or to the base station communicator 1730 for transmission to one or more other base stations (e.g., base station 1705-*a* and base station 1705-*b*), or to the network communicator 1740 for transmission to a core network 1745, which may be an example of one or more aspects of the core network 130 described with reference to FIG. 1. The processor 1710 may handle, alone or in connection with the wireless communication manager 1760, one or more aspects of communicating over (or managing communications over) one or more radio frequency spectrum bands.

The transceiver(s) 1750 may include a modem configured to modulate packets and provide the modulated packets to the antennas 1755 for transmission, and to demodulate packets received from the antennas 1755. The transceiver(s) 1750 may, in some examples, be implemented as one or more transmitters and one or more separate receivers. The transceiver(s) 1750 may support communications in one or more radio frequency spectrum bands. The transceiver(s) 1750 may be configured to communicate bi-directionally, via the antennas 1755, with one or more UEs or apparatuses, such as one or more of the UEs or apparatus described with reference to FIGS. 1-3, 5-9, and 14-16. The base station 1705 may communicate with the core network 1745 through the network communicator 1740. The base station 1705 may also communicate with other base stations, such as the base station 1705-*a* and the base station 1705-*b*, using the base station communicator 1730.

The wireless communication manager 1760 may be configured to perform or control some or all of the base station or apparatus techniques or functions described with reference to FIGS. 1-7 and 10-13. The wireless communication manager 1760, or portions of it, may include a processor, or some or all of the functions of the wireless communication manager 1760 may be performed by the processor 1710 or in connection with the processor 1710. In some examples, the wireless communication manager 1760 may be an example of aspects of one or more of the wireless communication managers described with reference to FIGS. 10-13.

Figure 18:
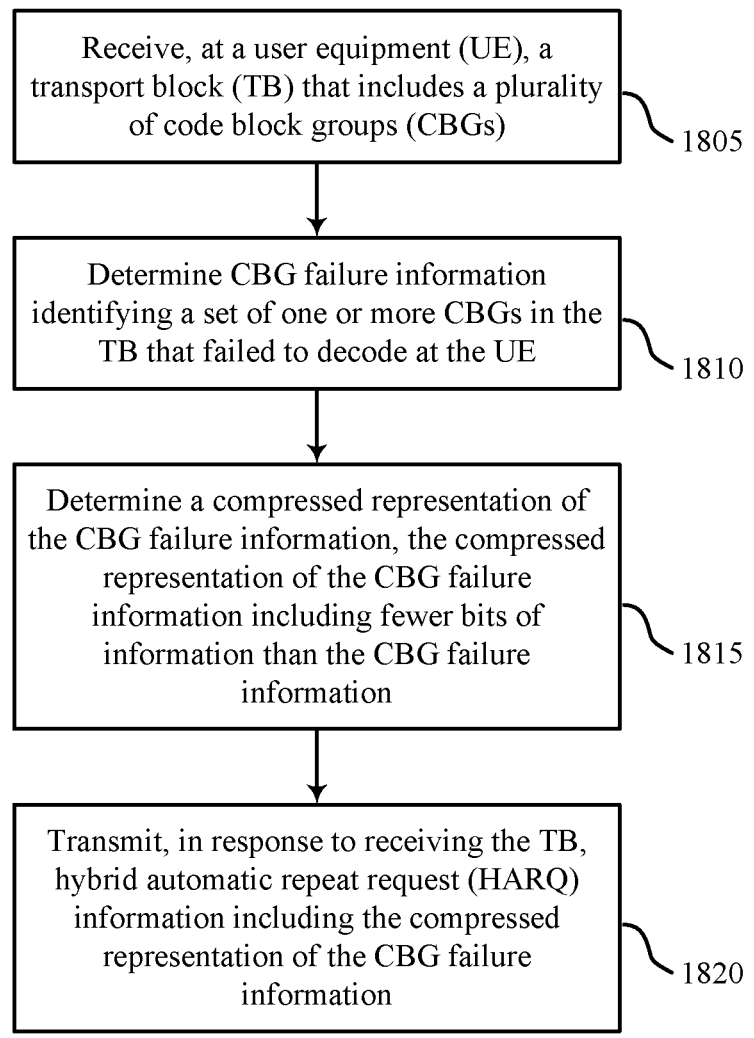
FIGS. 18-27 are flow charts illustrating examples of methods for wireless communication, in accordance with various aspects of the present disclosure.

FIG. 18 is a flow chart illustrating an example of a method 1800 for wireless communication, in accordance with various aspects of the present disclosure. For clarity, the method 1800 is described below with reference to aspects of one or more of the UEs described with reference to FIGS. 1-3, 5-7, and 16, aspects of the apparatus described with reference to FIG. 8, or aspects of one or more of the wireless communication managers described with reference to FIGS. 8, 9, and 16. In some examples, a UE may execute one or more sets of codes to control the functional elements of the UE to perform the functions described below. Additionally or alternatively, the UE may perform one or more of the functions described below using special-purpose hardware.

At block 1805, the method 1800 may include receiving, at a UE, a TB that includes a plurality of CBGs, as described for example with reference to FIGS. 5 and 6. In some examples, the TB may be part of an eMBB transmission to the UE, and at least one resource of the eMBB transmission may be punctured by a URLLC associated with a second UE. In some examples, the operation(s) at block 1805 may be performed using the transport block receiver described with reference to FIGS. 8 and 9.

At block 1810, the method 1800 may include determining CBG failure information identifying a set of one or more CBGs in the TB that failed to decode at the UE, as described for example with reference to FIGS. 5 and 6. In some examples, the operation(s) at block 1810 may be performed using the CBG failure information determiner described with reference to FIGS. 8 and 9.

At block 1815, the method 1800 may include determining a compressed representation of the CBG failure information, as described for example with reference to FIGS. 5 and 6. The compressed representation of the CBG failure information may include fewer bits of information than the CBG failure information determined at block 1810. In some examples, the operation(s) at block 1815 may be performed using the CBG failure information compressor described with reference to FIGS. 8 and 9.

At block 1820, the method 1800 may include transmitting, in response to receiving the TB, HARQ information including the compressed representation of the CBG failure information, as described for example with reference to FIGS. 5 and 6. In some examples, the operation(s) at block 1820 may be performed using the HARQ transmission manager described with reference to FIGS. 8 and 9.

Figure 19:
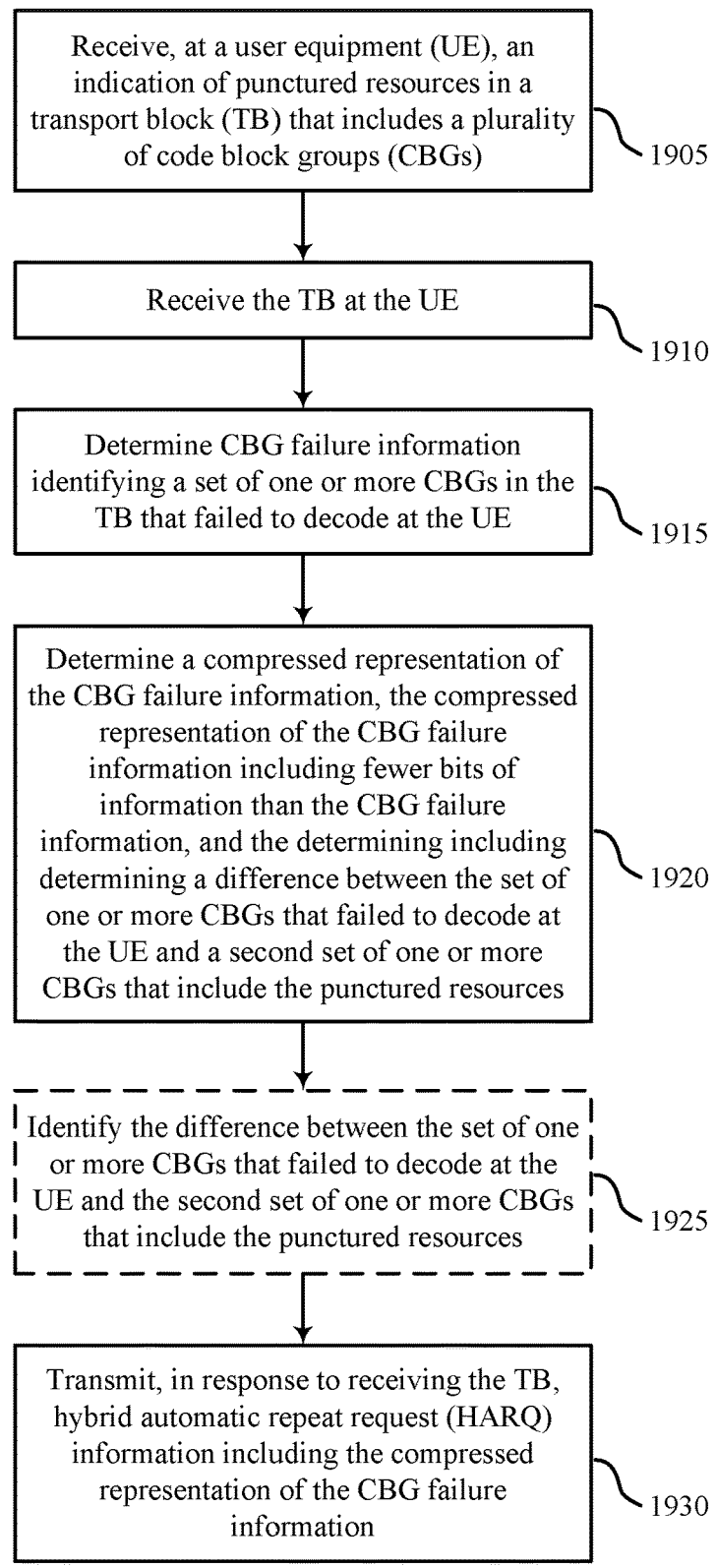

FIG. 19 is a flow chart illustrating an example of a method 1900 for wireless communication, in accordance with various aspects of the present disclosure. For clarity, the method 1900 is described below with reference to aspects of one or more of the UEs described with reference to FIGS. 1-3, 5-7, and 16, aspects of the apparatus described with reference to FIG. 8, or aspects of one or more of the wireless communication managers described with reference to FIGS. 8, 9, and 16. In some examples, a UE may execute one or more sets of codes to control the functional elements of the UE to perform the functions described below. Additionally or alternatively, the UE may perform one or more of the functions described below using special-purpose hardware.

At block 1905, the method 1900 may include receiving, at a UE, an indication of punctured resources in a TB that includes a plurality of CBGs, as described for example with reference to FIG. 5. In some examples, the operation(s) at block 1905 may be performed using the punctured resource manager described with reference to FIGS. 8 and 9.

At block 1910, the method 1900 may include receiving, at the UE, the TB, as described for example with reference to FIG. 5. In some examples, the TB may be part of an eMBB transmission to the UE, and at least one resource of the eMBB transmission may be punctured by a URLLC associated with a second UE. In some examples, the operation(s) at block 1910 may be performed using the transport block receiver described with reference to FIGS. 8 and 9.

At block 1915, the method 1900 may include determining CBG failure information identifying a set of one or more CBGs in the TB that failed to decode at the UE, as described for example with reference to FIG. 5. In some examples, the operation(s) at block 1915 may be performed using the CBG failure information determiner described with reference to FIGS. 8 and 9.

At block 1920, the method 1900 may include determining a compressed representation of the CBG failure information, as described for example with reference to FIG. 5. The compressed representation of the CBG failure information may include fewer bits of information than the CBG failure information determined at block 1915. The compressed representation of the CBG failure information may be determined based at least in part on the indication of the punctured resources (received at block 1905). In some examples, determining the compressed representation of the CBG failure information based at least in part on the indication of the punctured resources may include determining a difference between the set of one or more CBGs that failed to decode at the UE and a second set of one or more CBGs that include the punctured resources. In some examples, the operation(s) at block 1920 may be performed using the CBG failure information compressor described with reference to FIGS. 8 and 9.

At block 1925, the method 1900 may optionally include identifying the difference determined at block 1920, as described for example with reference to FIG. 5. In some examples, the difference between the set of one or more CBGs that failed to decode at the UE and the second set of one or more CBGs that include the punctured resources may be identified based at least in part on the equation $m \log_2 N$, in which m is a number of CBGs in the difference, and N is a total number of CBGs in the TB. In some examples, the difference between the set of one or more CBGs that failed to decode at the UE and the second set of one or more CBGs that include the punctured resources may be identified based at least in part on a starting location and length of at least a first difference between the set of one or more CBGs that failed to decode at the UE and the second set of one or more CBGs that include the punctured resources. In some examples, the operation(s) at block 1925 may be performed using the CBG difference determiner described with reference to FIGS. 8 and 9.

At block 1930, the method 1900 may include transmitting, in response to receiving the TB, HARQ information including the compressed representation of the CBG failure information, as described for example with reference to FIG. 5. In some examples, the operation(s) at block 1930 may be performed using the HARQ transmission manager described with reference to FIGS. 8 and 9.

Figure 20:
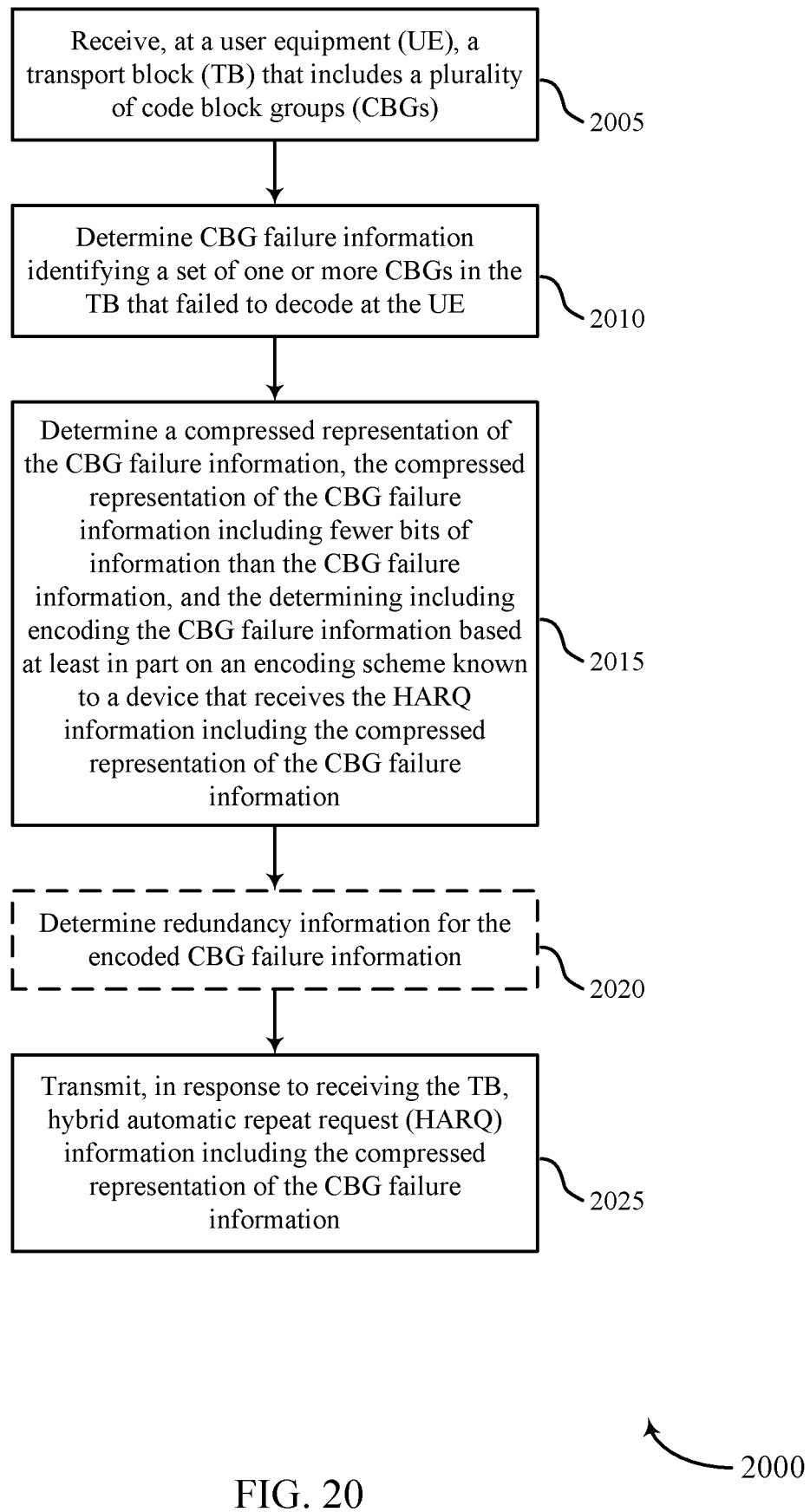

FIG. 20 is a flow chart illustrating an example of a method 2000 for wireless communication, in accordance with various aspects of the present disclosure. For clarity, the method 2000 is described below with reference to aspects of one or more of the UEs described with reference to FIGS. 1-3, 5-7, and 16, aspects of the apparatus described with reference to FIG. 8, or aspects of one or more of the wireless communication managers described with reference to FIGS. 8, 9, and 16. In some examples, a UE may execute one or more sets of codes to control the functional elements of the UE to perform the functions described below. Additionally or alternatively, the UE may perform one or more of the functions described below using special-purpose hardware.

At block 2005, the method 2000 may include receiving, at a UE, a TB that includes a plurality of CBGs, as described for example with reference to FIG. 6. In some examples, the TB may be part of an eMBB transmission to the UE, and at least one resource of the eMBB transmission may be punctured by a URLLC associated with a second UE. In some examples, the operation(s) at block 2010 may be performed using the transport block receiver described with reference to FIGS. 8 and 9.

At block 2010, the method 2000 may include determining CBG failure information identifying a set of one or more CBGs in the TB that failed to decode at the UE, as described for example with reference to FIG. 6. In some examples, the operation(s) at block 2010 may be performed using the CBG failure information determiner described with reference to FIGS. 8 and 9.

At block 2015, the method 2000 may include determining a compressed representation of the CBG failure information, as described for example with reference to FIG. 6. Determining the compressed representation of the CBG failure information may include encoding the CBG failure information based at least in part on an encoding scheme known to a device that receives the HARQ information including the compressed representation of the CBG failure information. In some examples, the encoding scheme may be based at least in part on a syndrome matrix, a linear block channel code, a Hamming code, a polar code, or a combination thereof. In some examples, the encoding may be performed based at least in part on a non-receipt, at the UE, of an indication of punctured resources in the TB. The compressed representation of the CBG failure information may include fewer bits of information than the CBG failure information determined at block 2010. In some examples, the operation(s) at block 2015 may be performed using the CBG failure information compressor described with reference to FIGS. 8 and 9.

At block 2020, the method 2000 may optionally include determining redundancy information for the encoded CBG failure information, as described for example with reference to FIG. 6. In some examples, the operation(s) at block 2025 may be performed using the CBG failure information redundancy determiner described with reference to FIG. 9.

At block 2025, the method 2000 may include transmitting, in response to receiving the TB, HARQ information including the compressed representation of the CBG failure information, as described for example with reference to FIG. 6. In some examples, transmitting the HARQ information including the compressed representation of the CBG failure information may include transmitting at least a portion of the encoded CBG failure information. In some examples, transmitting the HARQ information including the compressed representation of the CBG failure information may include transmitting at least the portion of the encoded CBG failure information with at least a portion of the redundancy information. In some examples, the operation(s) at block 2025 may be performed using the HARQ transmission manager described with reference to FIGS. 8 and 9.

Figure 21:
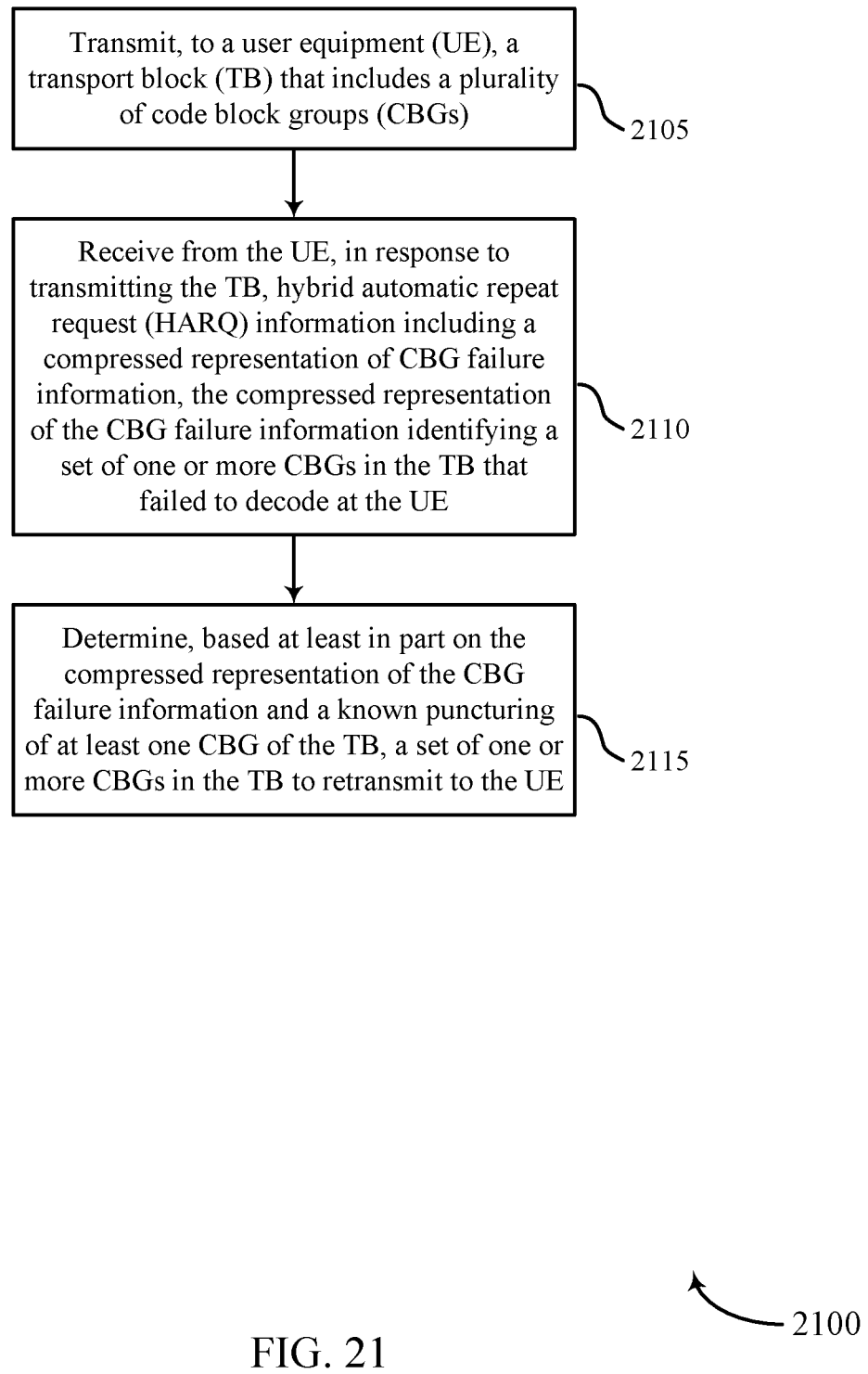

FIG. 21 is a flow chart illustrating an example of a method 2100 for wireless communication, in accordance with various aspects of the present disclosure. For clarity, the method 2100 is described below with reference to aspects of one or more of the base stations described with reference to FIGS.

1-3, 5-7, and 17, aspects of the apparatus described with reference to FIG. 10, or aspects of one or more of the wireless communication managers described with reference to FIGS. 10, 11, and 17. In some examples, a base station may execute one or more sets of codes to control the functional elements of the base station to perform the functions described below. Additionally or alternatively, the base station may perform one or more of the functions described below using special-purpose hardware.

At block 2105, the method 2100 may include transmitting, to a UE, a TB that includes a plurality of CBGs, as described for example with reference to FIGS. 5 and 6. In some examples, the TB may be part of an eMBB transmission to the UE, and at least one resource of the eMBB transmission is punctured by a URLLC associated with a second UE. In some examples, the operation(s) at block 2105 may be performed using the transport block transmitter described with reference to FIGS. 10 and 11.

At block 2110, the method 2100 may include receiving from the UE, in response to transmitting the TB, HARQ information including a compressed representation of CBG failure information, as described for example with reference to FIGS. 5 and 6. The compressed representation of the CBG failure information may identify a set of one or more CBGs in the TB that failed to decode at the UE. In some examples, the operation(s) at block 2110 may be performed using the HARQ manager described with reference to FIGS. 10 and 11.

At block 2115, the method 2100 may include determining, based at least in part on the compressed representation of the CBG failure information and a known puncturing of at least one CBG of the TB, a set of one or more CBGs in the TB to retransmit to the UE, as described for example with reference to FIGS. 5 and 6. In some examples, the operation(s) at block 2115 may be performed using the failed CBG determiner described with reference to FIGS. 10 and 11.

Figure 22:
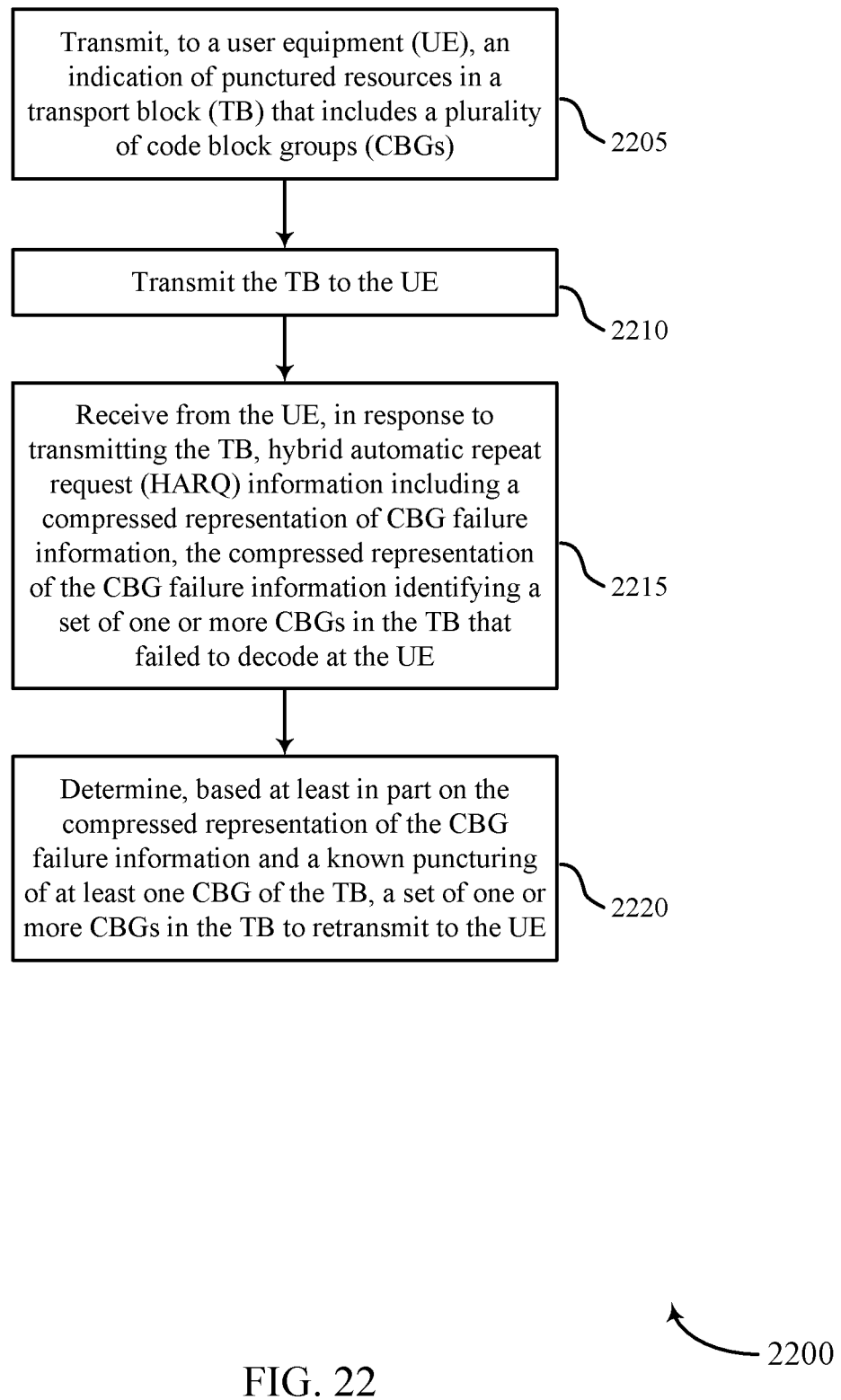

FIG. 22 is a flow chart illustrating an example of a method 2200 for wireless communication, in accordance with various aspects of the present disclosure. For clarity, the method 2200 is described below with reference to aspects of one or more of the base stations described with reference to FIGS. 1-3, 5-7, and 17, aspects of the apparatus described with reference to FIG. 10, or aspects of one or more of the wireless communication managers described with reference to FIGS. 10, 11, and 17. In some examples, a base station may execute one or more sets of codes to control the functional elements of the base station to perform the functions described below. Additionally or alternatively, the base station may perform one or more of the functions described below using special-purpose hardware.

At block 2205, the method 2200 may include transmitting, to a UE, an indication of punctured resources in a TB, as described for example with reference to FIG. 5. In some examples, the operation(s) at block 2205 may be performed using the punctured resource identifier described with reference to FIGS. 10 and 11.

At block 2210, the method 2200 may include transmitting, to the UE, the TB. The TB may include a plurality of CBGs, as described for example with reference to FIG. 5. In some examples, the TB may be part of an eMBB transmission to the UE, and at least one resource of the eMBB transmission is punctured by a URLLC associated with a second UE. In some examples, the operation(s) at block 2210 may be performed using the transport block transmitter described with reference to FIGS. 10 and 11.

At block 2215, the method 2200 may include receiving from the UE, in response to transmitting the TB, HARQ information including a compressed representation of CBG failure information, as described for example with reference to FIG. 5. The compressed representation of the CBG failure information may identify a set of one or more CBGs in the TB that failed to decode at the UE. The compressed representation of the CBG failure information may be based at least in part on the indication of the punctured resources. In some examples, the compressed representation of the CBG failure information may include an indication of a difference between the set of one or more CBGs that failed to decode at the UE and a second set of one or more CBGs that include the punctured resources. In some examples, the difference between the set of one or more CBGs that failed to decode at the UE and the second set of one or more CBGs that include the punctured resources may be based at least in part on an equation $m \log_2 N$, wherein m is a number of CBGs in the difference, and N is a total number of CBGs in the TB. In some examples, the indication of the difference between the set of one or more CBGs that failed to decode at the UE and the second set of one or more CBGs that include the punctured resources may be based at least in part on a starting location and length of at least a first difference between the set of one or more CBGs that failed to decode at the UE and the second set of one or more CBGs that include the punctured resources. In some examples, the operation(s) at block 2215 may be performed using the HARQ manager described with reference to FIGS. 10 and 11.

At block 2220, the method 2200 may include determining, based at least in part on the compressed representation of the CBG failure information and a known puncturing of at least one CBG of the TB, a set of one or more CBGs in the TB to retransmit to the UE, as described for example with reference to FIG. 5. In some examples, determining the set of one or more CBGs to retransmit to the UE may include combining the second set of one or more CBGs that include the punctured resources with a third set of one or more CBGs identified by the difference between the set of one or more CBGs that failed to decode at the UE and the second set of one or more CBGs that include the punctured resources. In some examples, the operation(s) at block 2220 may be performed using the failed CBG determiner described with reference to FIGS. 10 and 11.

Figure 23:
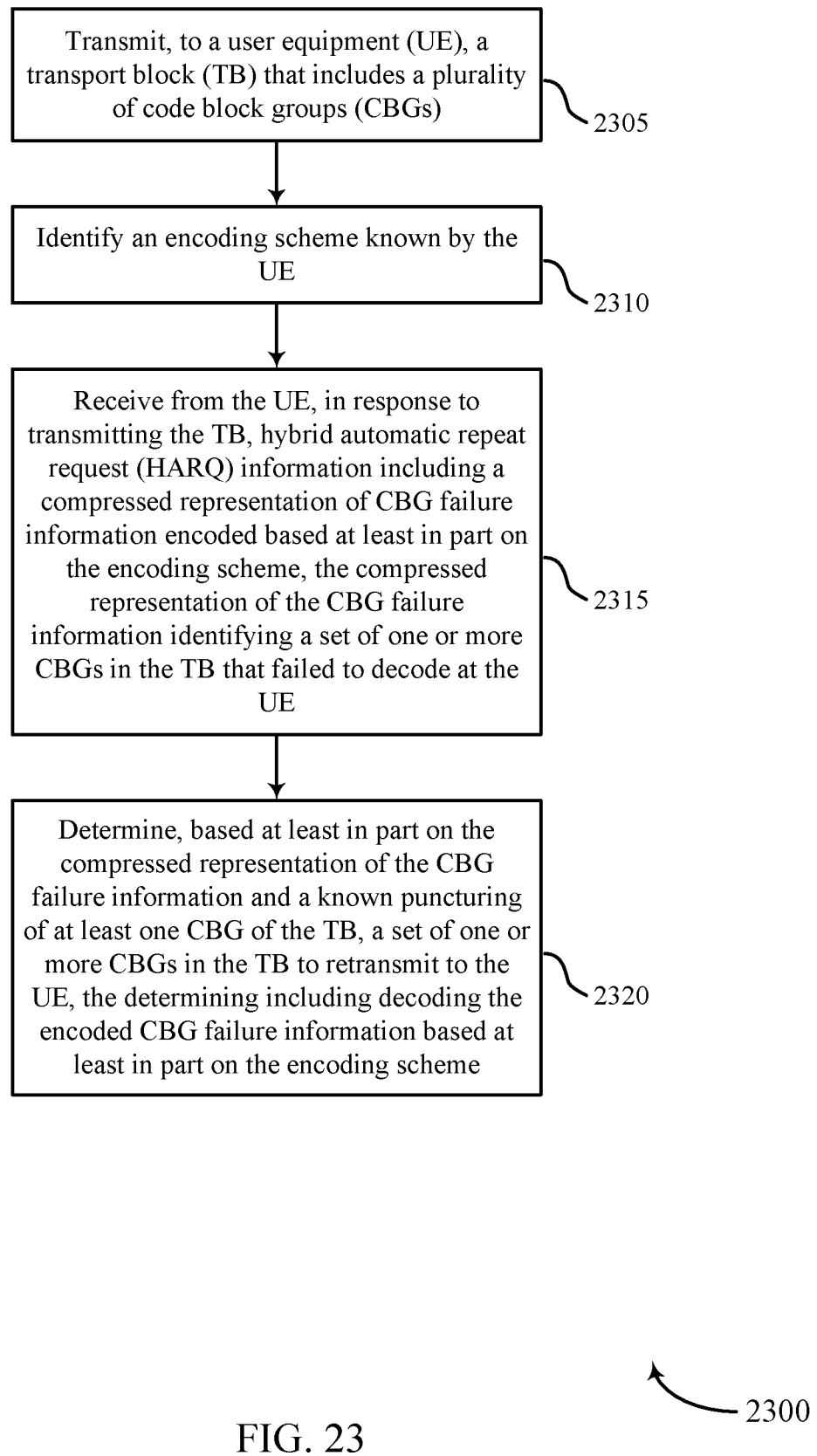

FIG. 23 is a flow chart illustrating an example of a method 2300 for wireless communication, in accordance with various aspects of the present disclosure. For clarity, the method 2300 is described below with reference to aspects of one or more of the base stations described with reference to FIGS. 1-3, 5-7, and 17, aspects of the apparatus described with reference to FIG. 10, or aspects of one or more of the wireless communication managers described with reference to FIGS. 10, 11, and 17. In some examples, a base station may execute one or more sets of codes to control the functional elements of the base station to perform the functions described below. Additionally or alternatively, the base station may perform one or more of the functions described below using special-purpose hardware.

At block 2305, the method 2300 may include transmitting, to a UE, a TB that includes a plurality of CBGs, as described for example with reference to FIG. 6. In some examples, the TB may be part of an eMBB transmission to the UE, and at least one resource of the eMBB transmission is punctured by a URLLC associated with a second UE. In some examples, the operation(s) at block 2305 may be performed using the transport block transmitter described with reference to FIGS. 10 and 11.

At block 2310, the method 2300 may include identifying an encoding scheme known by the UE, as described for example with reference to FIG. 6. In some examples, the encoding scheme may be based at least in part on a syndrome matrix, a linear block channel code, a Hamming code, a polar code, or a combination thereof. In some examples, the operation(s) at block 2310 may be performed using the encoding scheme identifier described with reference to FIG. 11.

At block 2315, the method 2300 may include receiving from the UE, in response to transmitting the TB, HARQ information including a compressed representation of CBG failure information, as described for example with reference to FIG. 6. The compressed representation of the CBG failure information may identify a set of one or more CBGs in the TB that failed to decode at the UE. The compressed representation of the CBG failure information may include the CBG failure information encoded based at least in part on the encoding scheme. In some examples, the encoded CBG failure information may be received with redundancy information for the encoded CBG failure information. The redundancy information may be based at least in part on the encoding scheme. In some examples, the operation(s) at block 2315 may be performed using the HARQ manager described with reference to FIGS. 10 and 11.

At block 2320, the method 2300 may include determining, based at least in part on the compressed representation of the CBG failure information and a known puncturing of at least one CBG of the TB, a set of one or more CBGs in the TB to retransmit to the UE, as described for example with reference to FIG. 6. In some examples, determining the set of one or more CBGs to retransmit to the UE may include decoding the encoded CBG failure information based at least in part on the encoding scheme. In some examples, the operation(s) at block 2320 may be performed using the failed CBG determiner described with reference to FIGS. 10 and 11.

Figure 24:
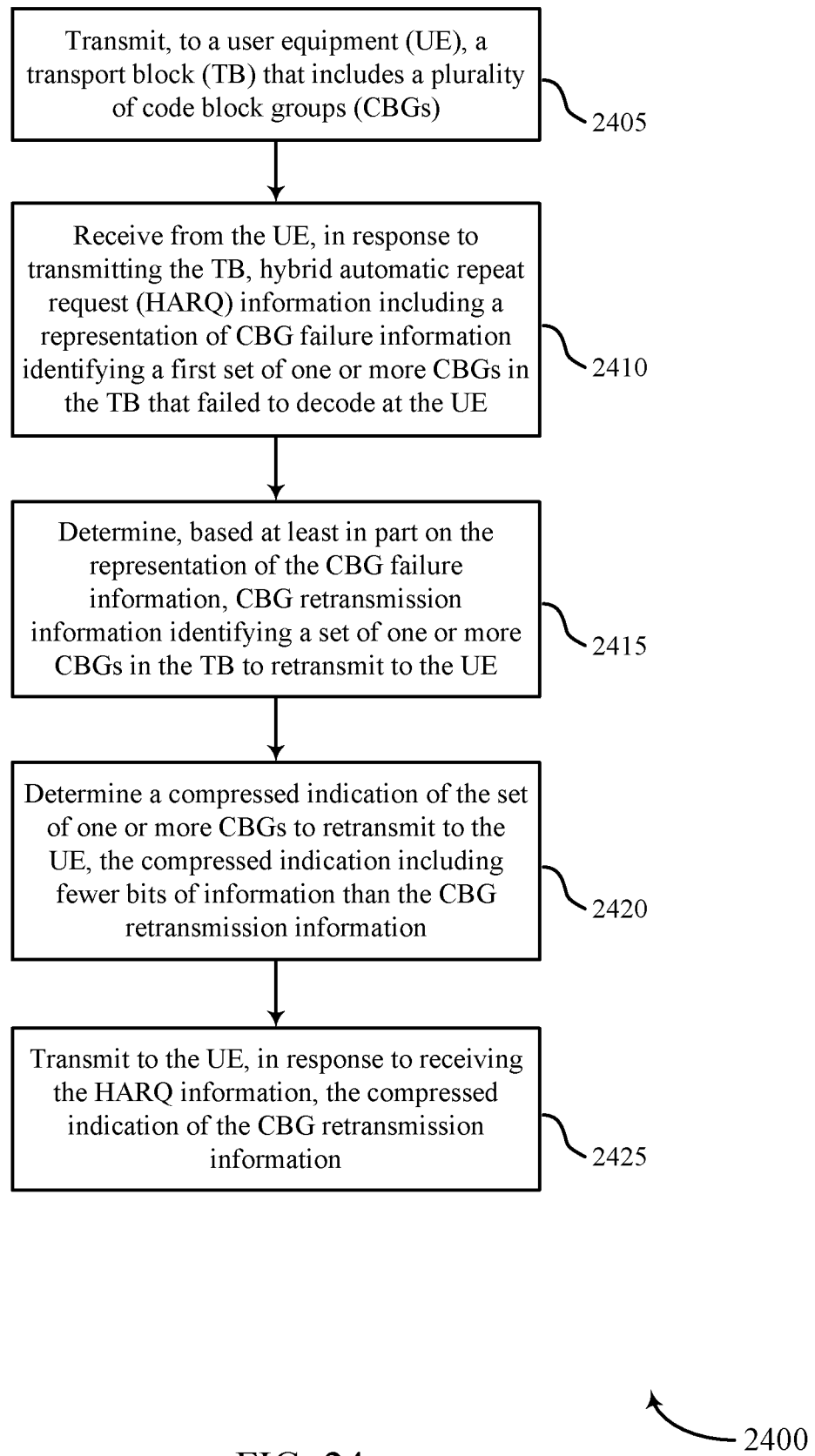

FIG. 24 is a flow chart illustrating an example of a method 2400 for wireless communication, in accordance with various aspects of the present disclosure. For clarity, the method 2300 is described below with reference to aspects of one or more of the base stations described with reference to FIGS. 1-3, 5-7, and 17, aspects of the apparatus described with reference to FIG. 12, or aspects of one or more of the wireless communication managers described with reference to FIGS. 12, 13, and 17. In some examples, a base station may execute one or more sets of codes to control the functional elements of the base station to perform the functions described below. Additionally or alternatively, the base station may perform one or more of the functions described below using special-purpose hardware.

At block 2405, the method 2400 may include transmitting, to a UE, a TB that includes a plurality of CBGs, as described for example with reference to FIG. 7. In some examples, the TB may be part of an eMBB transmission to the UE, and at least one resource of the eMBB transmission is punctured by a URLLC associated with a second UE. In some examples, the operation(s) at block 2405 may be performed using the transport block transmitter described with reference to FIGS. 12 and 13.

At block 2410, the method 2400 may include receiving from the UE, in response to transmitting the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the operation(s) at block 2410 may be performed using the HARQ manager described with reference to FIGS. 12 and 13.

At block 2415, the method 2400 may include determining, based at least in part on the representation of the CBG failure information, CBG retransmission information identifying a set of one or more CBGs in the TB to retransmit to the UE, as described for example with reference to FIG. 7. In some examples, the operation(s) at block 2415 may be performed using the CBG retransmission information determiner described with reference to FIGS. 12 and 13.

At block 2420, the method 2400 may include determining a compressed indication of the set of one or more CBGs to retransmit to the UE, as described for example with reference to FIG. 7. The compressed indication may include fewer bits of information than the CBG retransmission information. In some examples, the operation(s) at block 2420 may be performed using the CBG retransmission information compressor described with reference to FIGS. 12 and 13.

At block 2425, the method 2400 may include transmitting to the UE, in response to receiving the HARQ information, the compressed indication of the CBG retransmission information, as described for example with reference to FIG. 7. In some examples, the operation(s) at block 2425 may be performed using the CBG retransmission information indicator described with reference to FIGS. 12 and 13.

Figure 25:
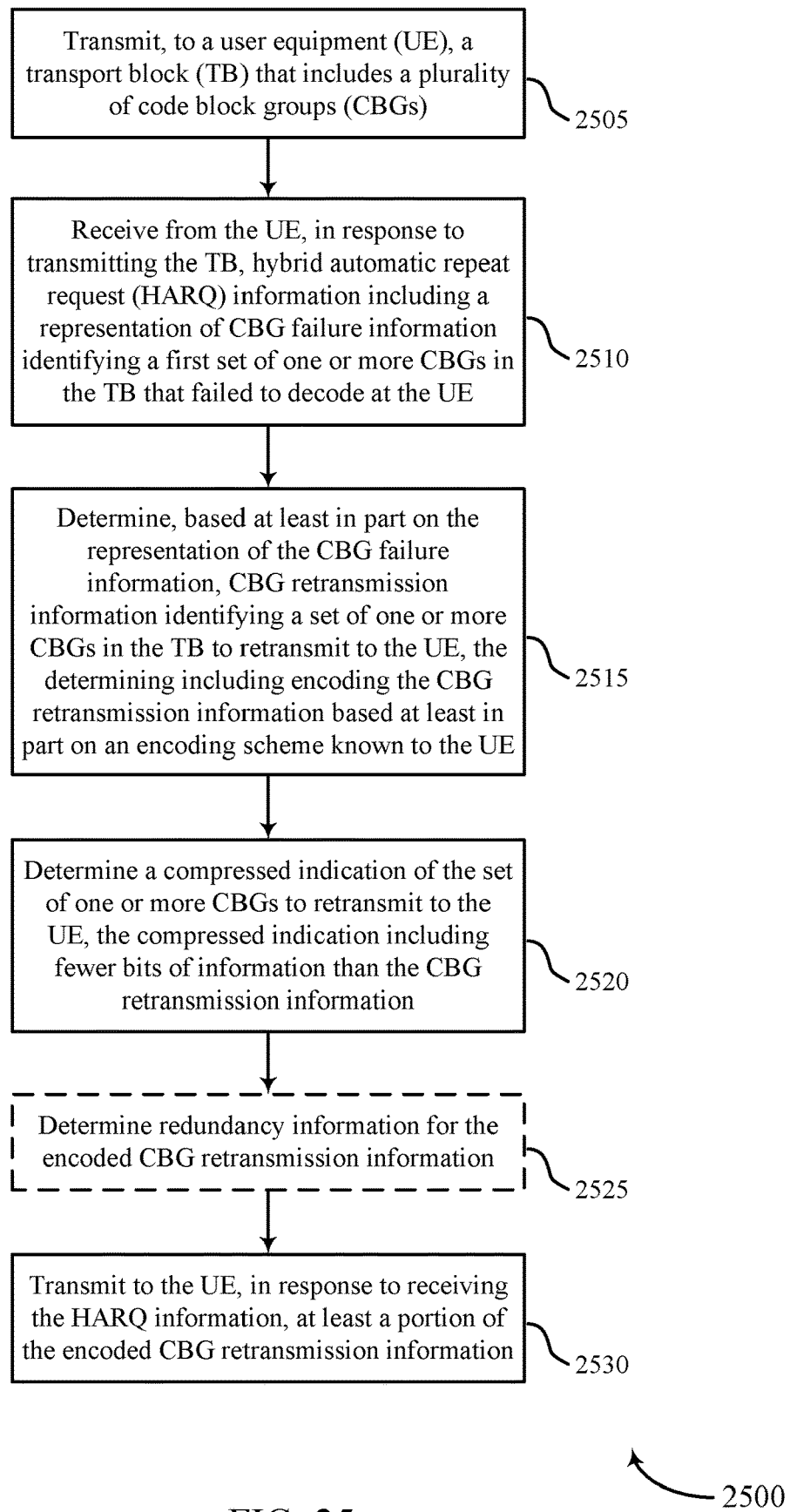

FIG. 25 is a flow chart illustrating an example of a method 2500 for wireless communication, in accordance with various aspects of the present disclosure. For clarity, the method 2300 is described below with reference to aspects of one or more of the base stations described with reference to FIGS. 1-3, 5-7, and 17, aspects of the apparatus described with reference to FIG. 12, or aspects of one or more of the wireless communication managers described with reference to FIGS. 12, 13, and 17. In some examples, a base station may execute one or more sets of codes to control the functional elements of the base station to perform the functions described below. Additionally or alternatively, the base station may perform one or more of the functions described below using special-purpose hardware.

At block 2505, the method 2500 may include transmitting, to a UE, a TB that includes a plurality of CBGs, as described for example with reference to FIG. 7. In some examples, the TB may be part of an eMBB transmission to the UE, and at least one resource of the eMBB transmission is punctured by a URLLC associated with a second UE. In some examples, the operation(s) at block 2505 may be performed using the transport block transmitter described with reference to FIGS. 12 and 13.

At block 2510, the method 2500 may include receiving from the UE, in response to transmitting the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be received in UCI. In some examples, the operation(s) at block 2510 may be performed using the HARQ manager described with reference to FIGS. 12 and 13.

At block 2515, the method 2500 may include determining, based at least in part on the representation of the CBG failure information, CBG retransmission information identifying a set of one or more CBGs in the TB to retransmit to the UE, as described for example with reference to FIG. 7. In some examples, the operation(s) at block 2515 may be performed using the CBG retransmission information determiner described with reference to FIGS. 12 and 13.

At block 2520, the method 2500 may include determining a compressed indication of the set of one or more CBGs to retransmit to the UE, as described for example with reference to FIG. 7. The compressed indication may include fewer bits of information than the CBG retransmission information. In some examples, determining the compressed indication of the CBG retransmission information may include encoding the CBG retransmission information based at least in part on an encoding scheme known to the UE. In some examples, the encoding scheme may be based at least in part on a syndrome matrix, a linear block channel code, a Hamming code, a polar code, or a combination thereof. In some examples, determining the compressed indication of the CBG retransmission information may include scrambling, based at least in part on the CBG retransmission information, a CRC of DCI transmitted to the UE. In some examples, determining the compressed indication of the CBG retransmission information may include generating a CRC for DCI transmitted to the UE, with the CRC being generated based at least in part on the DCI and the CBG retransmission information. In some examples, the operation(s) at block 2520 may be performed using the CBG retransmission information compressor described with reference to FIGS. 12 and 13.

At block 2525, the method 2500 may optionally include determining redundancy information for the encoded CBG retransmission information, as described for example with reference to FIG. 7. In some examples, the operation(s) at block 2525 may be performed using the CBG retransmission information redundancy determiner described with reference to FIG. 13.

At block 2530, the method 2500 may include transmitting to the UE, in response to receiving the HARQ information, the compressed indication of the CBG retransmission information, as described for example with reference to FIG. 7. In some examples, transmitting the compressed indication of the CBG retransmission information may include transmitting at least a portion of the encoded CBG retransmission information. In some examples, transmitting the compressed indication of the CBG retransmission information may include transmitting at least the portion of the encoded CBG retransmission information with at least a portion of the redundancy information. In some examples, the compressed indication of the CBG retransmission information may be transmitted in DCI transmitted with the set of one or more CBGs to retransmit to the UE. In some examples, the operation(s) at block 2530 may be performed using the CBG retransmission information indicator described with reference to FIGS. 12 and 13.

Figure 26:
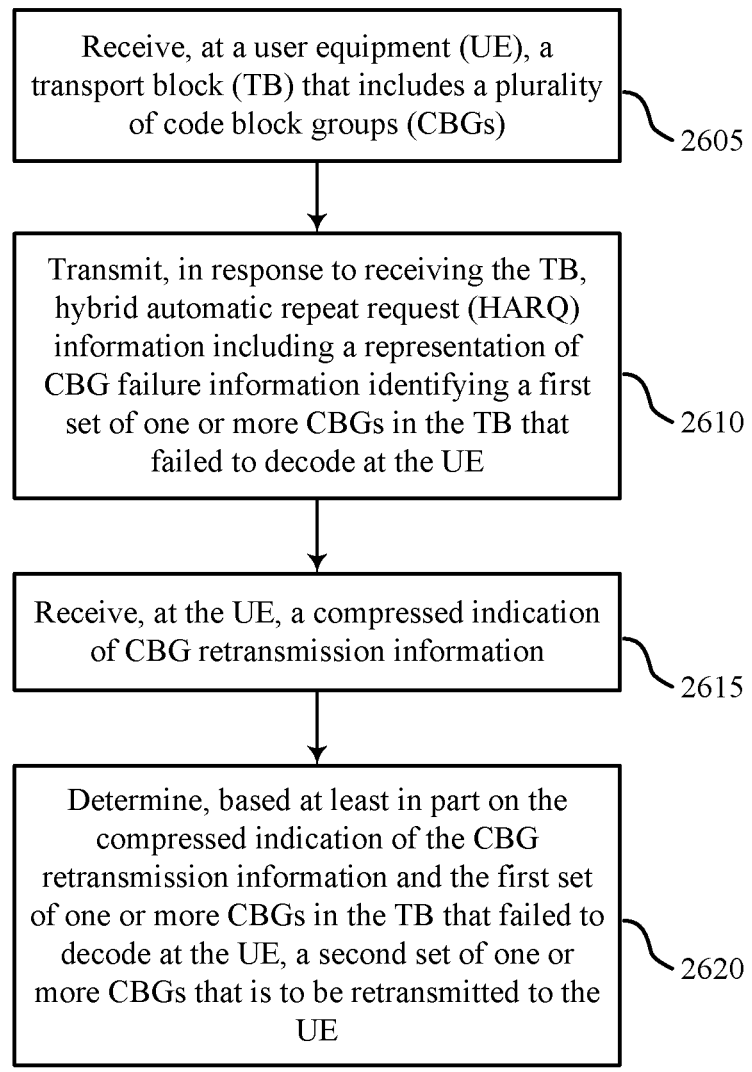

FIG. 26 is a flow chart illustrating an example of a method 2600 for wireless communication, in accordance with various aspects of the present disclosure. For clarity, the method 2600 is described below with reference to aspects of one or more of the UEs described with reference to FIGS. 1-3, 5-7, and 16, aspects of the apparatus described with reference to FIG. 14, or aspects of one or more of the wireless communication managers described with reference to FIGS. 14-16. In some examples, a UE may execute one or more sets of codes to control the functional elements of the UE to perform the functions described below. Additionally or alternatively, the UE may perform one or more of the functions described below using special-purpose hardware.

At block 2605, the method 2600 may include receiving, at a UE, a TB that includes a plurality of CBGs, as described for example with reference to FIG. 7. In some examples, the TB may be part of an eMBB transmission to the UE, and at least one resource of the eMBB transmission may be punctured by a URLLC associated with a second UE. In some examples, the operation(s) at block 2605 may be performed using the transport block receiver described with reference to FIGS. 14 and 15.

At block 2610, the method 2600 may include transmitting, in response to receiving the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be transmitted in UCI. In some examples, the operation(s) at block 2610 may be performed using the HARQ transmission manager described with reference to FIGS. 14 and 15.

At block 2615, the method 2600 may include receiving, at the UE, a compressed indication of CBG retransmission information, as described for example with reference to FIG. 7. In some examples, the compressed indication of the CBG retransmission information is received in DCI. In some examples, the operation(s) at block 2615 may be performed using the CBG retransmission information manager described with reference to FIGS. 14 and 15.

At block 2620, the method 2600 may include determining, based at least in part on the compressed indication of the CBG retransmission information and the first set of one or more CBGs in the TB that failed to decode at the UE, a second set of one or more CBGs that is to be retransmitted to the UE, as described for example with reference to FIG. 7. In some examples, the operation(s) at block 2620 may be performed using the retransmitted CBG determiner described with reference to FIGS. 14 and 15.

Figure 27:
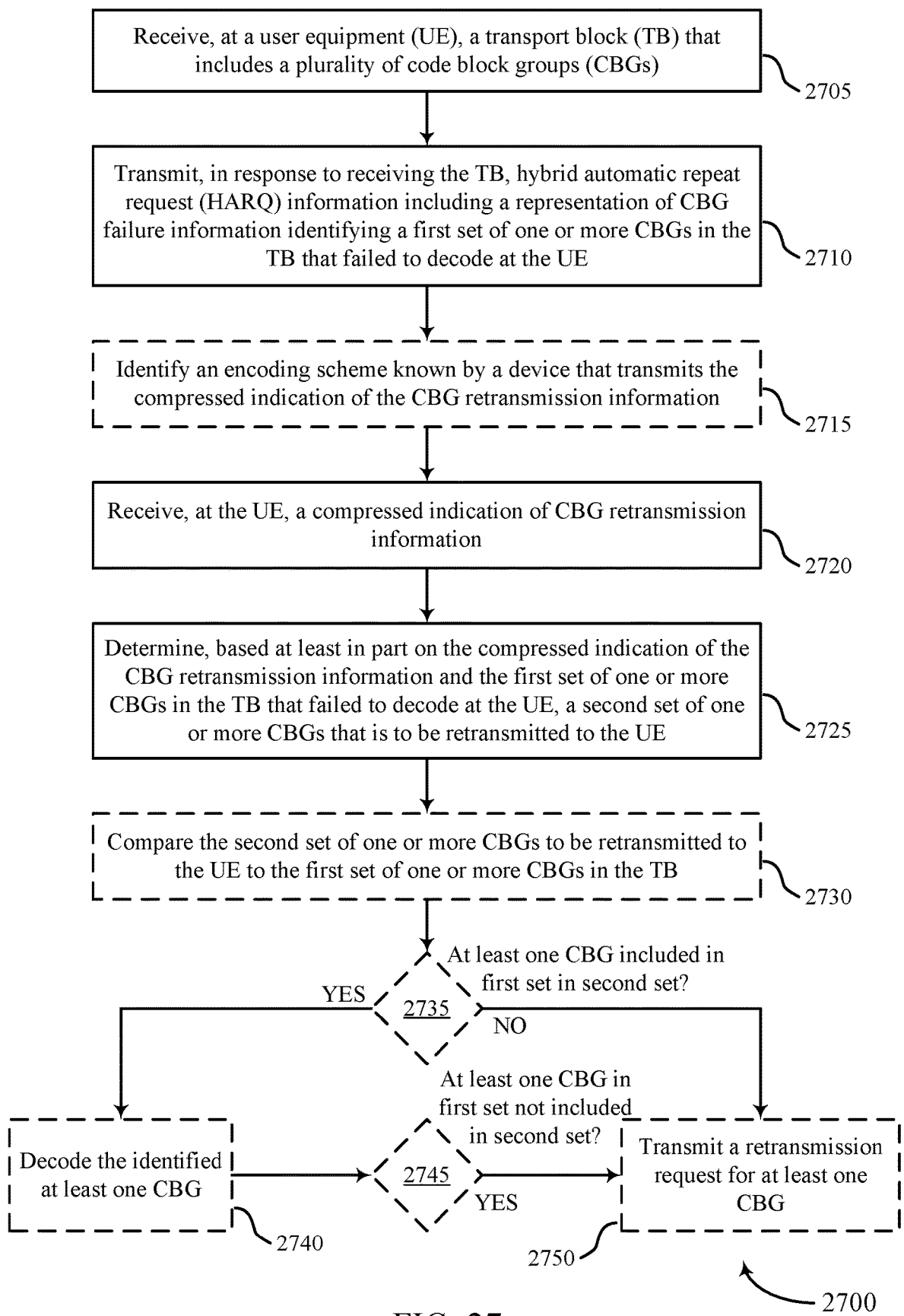

FIG. 27 is a flow chart illustrating an example of a method 2700 for wireless communication, in accordance with various aspects of the present disclosure. For clarity, the method 2700 is described below with reference to aspects of one or more of the UEs described with reference to FIGS. 1-3, 5-7, and 16, aspects of the apparatus described with reference to FIG. 14, or aspects of one or more of the wireless communication managers described with reference to FIGS. 14-16. In some examples, a UE may execute one or more sets of codes to control the functional elements of the UE to perform the functions described below. Additionally or alternatively, the UE may perform one or more of the functions described below using special-purpose hardware.

At block 2705, the method 2700 may include receiving, at a UE, a TB that includes a plurality of CBGs, as described for example with reference to FIG. 7. In some examples, the TB may be part of an eMBB transmission to the UE, and at least one resource of the eMBB transmission may be punctured by a URLLC associated with a second UE. In some examples, the operation(s) at block 2705 may be performed using the transport block receiver described with reference to FIGS. 14 and 15.

At block 2710, the method 2700 may include transmitting, in response to receiving the TB, HARQ information including a representation of CBG failure information identifying a first set of one or more CBGs in the TB that failed to decode at the UE, as described for example with reference to FIG. 7. In some examples, the representation of the CBG failure information may include the CBG failure information or a compressed representation of the CBG failure information. In some examples, the HARQ information including the representation of the CBG failure information may be transmitted in UCI. In some examples, the operation(s) at block 2710 may be performed using the HARQ transmission manager described with reference to FIGS. 14 and 15.

At block 2715, the method 2700 may include identifying an encoding scheme known by a device that transmits the compressed indication of the CBG retransmission information. In some examples, the encoding scheme may be based at least in part on a syndrome matrix, a linear block channel code, a Hamming code, a polar code, or a combination thereof. In some examples, the operation(s) at block 2715 may be performed using the CBG retransmission information manager described with reference to FIGS. 14 and 15.

At block 2720, the method 2700 may include receiving, at the UE, a compressed indication of CBG retransmission information, as described for example with reference to FIG. 7. In some examples, the compressed indication of the CBG retransmission information may include the CBG retransmission information encoded based at least in part on the encoding scheme. In some examples, the encoded CBG retransmission information may be received with redundancy information for the encoded CBG retransmission information. The redundancy information may be based at least in part on the encoding scheme. In some examples, the compressed indication of the CBG retransmission information may be received in DCI associated with the second set of one or more CBGs. In some examples, receiving the compressed indication of the CBG retransmission information may include receiving DCI having a CRC scrambled based at least in part on the CBG retransmission information. In some examples, receiving the compressed indication of the CBG retransmission information may include receiving DCI having a CRC generated based at least in part on the DCI and the CBG retransmission information. In some examples, the operation(s) at block 2720 may be performed using the CBG retransmission information manager described with reference to FIGS. 14 and 15.

At block 2725, the method 2700 may include determining, based at least in part on the compressed indication of the CBG retransmission information and the first set of one or more CBGs in the TB that failed to decode at the UE, a second set of one or more CBGs that is to be retransmitted to the UE, as described for example with reference to FIG. 7. In some examples, determining the second set of one or more CBGs that is to be retransmitted to the UE may include decoding the encoded CBG retransmission information based at least in part on the encoding scheme. In some examples, the operation(s) at block 2725 may be performed using the retransmitted CBG determiner described with reference to FIGS. 14 and 15.

At block 2730, the method 2700 may optionally include comparing the second set of one or more CBGs to be retransmitted to the UE to the first set of one or more CBGs in the TB, as described for example with reference to FIG. 7. In some examples, the operation(s) at block 2730 may be performed using the retransmitted CBG verifier described with reference to FIG. 15.

At block 2735, the method 2700 may optionally include determining whether at least one CBG in the first set of one or more CBGs in the TB is included in the second set of one or more CBGs to be retransmitted to the UE, as described for example with reference to FIG. 7. When at least one CBG is identified at block 2735, the method 2700 may continue at block 2740. When at least one CBG is not identified at block 2735, the method 2700 may continue at block 2750. In some examples, the operation(s) at block 2735 may be performed using the retransmitted CBG verifier described with reference to FIG. 15.

At block 2740, the method 2700 may optionally include decoding the at least one CBG identified at block 2735, as described for example with reference to FIG. 7. In some examples, the operation(s) at block 2740 may be performed using the CBG decoder described with reference to FIG. 15.

At block 2745, the method 2700 may optionally include determining whether at least one CBG in the first set of one or more CBGs in the TB is not included in the second set of one or more CBGs to be retransmitted to the UE, as described for example with reference to FIG. 7. When at least one CBG is identified at block 2745, the method 2700 may continue at block 2750. When at least one CBG is not identified at block 2745, the method 2700 may finish. In some examples, the operation(s) at block 2745 may be performed using the retransmitted CBG verifier described with reference to FIG. 15.

At block 2750, the method 2700 may optionally include transmitting a retransmission request for at least one CBG in the first set of one or more CBGs in the TB that is not included in the second set of one or more CBGs to be retransmitted to the UE, as described for example with reference to FIG. 7. In some examples, the operation(s) at block 2750 may be performed using the HARQ transmission manager described with reference to FIG. 15.

The methods 1800, 1900, 2000, 2100, 2200, 2300, 2400, 2500, 2600, and 2700 described with reference to FIGS. 18-27 may provide for wireless communication. It should be noted that the methods are example implementations of some of the techniques described in the present disclosure, and the operations of the methods may be rearranged, combined with other operations of the same or different method, or otherwise modified, such that other implementations are possible. In some examples, operations of the methods 1800, 1900, 2000, 2600, or 2700 may be combined. In some examples, operations of the methods 2100, 2200, 2300, 2400, or 2500 may be combined. In some examples, operations may be added to the methods.

Techniques described herein may be used for various wireless communication systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A may be referred to as CDMA2000 1×, 1×, etc. IS-856 (TIA-856) may be referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP LTE and LTE-A are new releases of UMTS that use E-UTRA. UTRA, E-UTRA, UMTS, LTE, LTE-A, and GSM are described in documents from an organization named 3GPP. CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over an unlicensed or shared bandwidth. The description above, however, describes an LTE/LTE-A system for purposes of example, and LTE terminology is used in much of the description above, although the techniques are applicable beyond LTE/LTE-A applications.

The detailed description set forth above in connection with the appended drawings describes examples and does not represent all of the examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Components implementing functions may also be physically located at various positions, including being distributed such that portions of functions are implemented at different physical locations. As used herein, including in the claims, the term "or," when used in a list of two or more items, means that any one of the listed items can be employed by itself, or any combination of two or more of the listed items can be employed. For example, if a composition is described as containing components A, B, or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can include RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel techniques disclosed herein.

What is claimed is:

1. A method for wireless communication, comprising:
   receiving, at a user equipment (UE), a transport block (TB) that includes a plurality of code block groups (CBGs);
   receiving an indication of punctured resources in the TB;
   determining CBG failure information identifying a set of one or more CBGs in the TB that failed to decode at the UE;
   determining a compressed representation of the CBG failure information, the compressed representation of the CBG failure information including fewer bits of information than the CBG failure information and wherein the compressed representation of the CBG failure information is determined based at least in part on the indication of the punctured resources; and
   transmitting, in response to receiving the TB, hybrid automatic repeat request (HARQ) information including the compressed representation of the CBG failure information.

2. The method of claim 1, wherein determining the compressed representation of the CBG failure information based at least in part on the indication of the punctured resources comprises:

determining a difference between the set of one or more CBGs that failed to decode at the UE and a second set of one or more CBGs that include the punctured resources.

3. The method of claim 2, further comprising:
identifying the difference between the set of one or more CBGs that failed to decode at the UE and the second set of one or more CBGs that include the punctured resources based at least in part on an equation m log 2 N, wherein m is a number of CBGs in the difference, and N is a total number of CBGs in the TB.

4. The method of claim 2, further comprising:
identifying the difference between the set of one or more CBGs that failed to decode at the UE and the second set of one or more CBGs that include the punctured resources based at least in part on a starting location and length of at least a first difference between the set of one or more CBGs that failed to decode at the UE and the second set of one or more CBGs that include the punctured resources.

5. The method of claim 1, wherein determining the compressed representation of the CBG failure information comprises:
encoding the CBG failure information based at least in part on an encoding scheme known to a device that receives the HARQ information including the compressed representation of the CBG failure information,
wherein transmitting the HARQ information including the compressed representation of the CBG failure information comprises transmitting at least a portion of the encoded CBG failure information.

6. The method of claim 5, wherein the encoding scheme is based at least in part on a syndrome matrix, a linear block channel code, a Hamming code, a polar code, or a combination thereof.

7. The method of claim 5, further comprising:
determining redundancy information for the encoded CBG failure information,
wherein transmitting the HARQ information including the compressed representation of the CBG failure information comprises transmitting at least the portion of the encoded CBG failure information with at least a portion of the redundancy information.

8. The method of claim 1, wherein the TB is part of an enhanced mobile broadband (eMBB) transmission to the UE, and at least one resource of the eMBB transmission is punctured by an ultra reliable low latency communication (URLLC) associated with a second UE.

9. An apparatus for wireless communication, comprising:
a processor;
memory coupled with the processor; and
instructions stored in the memory, the instructions being executable by the processor to:
receive, at a user equipment (UE), a transport block (TB) that includes a plurality of code block groups (CBGs);
receive an indication of punctured resources in the TB;
determine CBG failure information identifying a set of one or more CBGs in the TB that failed to decode at the UE;
determine a compressed representation of the CBG failure information, the compressed representation of the CBG failure information including fewer bits of information than the CBG failure information and wherein the compressed representation of the CBG failure information is determined based at least in part on the indication of the punctured resources; and
transmit, in response to receiving the TB, hybrid automatic repeat request (HARQ) information including the compressed representation of the CBG failure information.

10. The apparatus of claim 9, wherein determining the compressed representation of the CBG failure information based at least in part on the indication of the punctured resources comprises:
determining a difference between the set of one or more CBGs that failed to decode at the UE and a second set of one or more CBGs that include the punctured resources.

11. The apparatus of claim 10, the instructions further executable to:
identify the difference between the set of one or more CBGs that failed to decode at the UE and the second set of one or more CBGs that include the punctured resources based at least in part on an equation m log 2 N, wherein m is a number of CBGs in the difference, and N is a total number of CBGs in the TB.

12. The apparatus of claim 10, the instructions further executable to:
identify the difference between the set of one or more CBGs that failed to decode at the UE and the second set of one or more CBGs that include the punctured resources based at least in part on a starting location and length of at least a first difference between the set of one or more CBGs that failed to decode at the UE and the second set of one or more CBGs that include the punctured resources.

13. A method for wireless communication, comprising:
transmitting, to a user equipment (UE), a transport block (TB) that includes a plurality of code block groups (CBGs);
transmitting, to the UE, an indication of punctured resources in the TB;
receiving from the UE, in response to transmitting the TB, hybrid automatic repeat request (HARQ) information including a compressed representation of CBG failure information, the compressed representation of the CBG failure information identifying a set of one or more CBGs in the TB that failed to decode at the UE and wherein the compressed representation of the CBG failure information is based at least in part on the indication of the punctured resources; and
determining, based at least in part on the compressed representation of the CBG failure information and a known puncturing of at least one CBG of the TB, a set of one or more CBGs in the TB to retransmit to the UE.

14. The method of claim 13, wherein the compressed representation of the CBG failure information comprises an indication of a difference between the set of one or more CBGs that failed to decode at the UE and a second set of one or more CBGs that include the punctured resources.

15. The method of claim 14, wherein determining the set of one or more CBGs to retransmit to the UE comprises:
combining the second set of one or more CBGs that include the punctured resources with a third set of one or more CBGs identified by the difference between the set of one or more CBGs that failed to decode at the UE and the second set of one or more CBGs that include the punctured resources.

16. The method of claim 14, wherein the difference between the set of one or more CBGs that failed to decode at the UE and the second set of one or more CBGs that include the punctured resources is based at least in part on an equation m log 2N, wherein m is a number of CBGs in the difference, and N is a total number of CBGs in the TB.

17. The method of claim 14, wherein the indication of the difference between the set of one or more CBGs that failed to decode at the UE and the second set of one or more CBGs that include the punctured resources is based at least in part on a starting location and length of at least a first difference between the set of one or more CBGs that failed to decode at the UE and the second set of one or more CBGs that include the punctured resources.

18. The method of claim 13, further comprising:

identifying an encoding scheme known by the UE, wherein the compressed representation of the CBG failure information comprises the CBG failure information encoded based at least in part on the encoding scheme.

19. The method of claim 18, wherein determining the set of one or more CBGs to retransmit to the UE comprises:

decoding the encoded CBG failure information based at least in part on the encoding scheme.

20. The method of claim 18, wherein the encoding scheme is based at least in part on a syndrome matrix, a linear block channel code, a Hamming code, a polar code, or a combination thereof.

21. The method of claim 18, wherein the encoded CBG failure information is received with redundancy information for the encoded CBG failure information, the redundancy information based at least in part on the encoding scheme.

22. The method of claim 13, wherein the TB is part of an enhanced mobile broadband (eMBB) transmission to the UE, and at least one resource of the eMBB transmission is punctured by an ultra reliable low latency communication (URLLC) associated with a second UE.

23. An apparatus for wireless communication, comprising:

a processor;

memory coupled with the processor; and instructions stored in the memory, the instructions being executable by the processor to:

transmit, to a user equipment (UE), a transport block (TB) that includes a plurality of code block groups (CBGs);

transmit, to the UE, an indication of punctured resources in the TB;

receive from the UE, in response to transmitting the TB, hybrid automatic repeat request (HARQ) information including a compressed representation of CBG failure information, the compressed representation of the CBG failure information identifying a set of one or more CBGs in the TB that failed to decode at the UE and wherein the compressed representation of the CBG failure information is based at least in part on the indication of the punctured resources; and determine, based at least in part on the compressed representation of the CBG failure information and a known puncturing of at least one CBG of the TB, a set of one or more CBGs in the TB to retransmit to the UE.

24. The apparatus of claim 23, wherein the compressed representation of the CBG failure information comprises an indication of a difference between the set of one or more CBGs that failed to decode at the UE and a second set of one or more CBGs that include the punctured resources.

25. The apparatus of claim 24, wherein the determining the set of one or more CBGs to retransmit to the UE comprises:

combining the second set of one or more CBGs that include the punctured resources with a third set of one or more CBGs identified by the difference between the set of one or more CBGs that failed to decode at the UE and the second set of one or more CBGs that include the punctured resources.

* * * * *